(12) United States Patent
Hassan et al.

(10) Patent No.: US 11,456,602 B2
(45) Date of Patent: Sep. 27, 2022

(54) METHOD FOR STABILIZING AN AUTONOMOUS MICROGRID INCLUDING AN ACTIVE LOAD

(71) Applicant: KING FAHD UNIVERSITY OF PETROLEUM AND MINERALS, Dhahran (SA)

(72) Inventors: Mohammad Ali Ali Hassan, Dhahran (SA); Mohammad A. Abido, Dhahran (SA); Muhammed Y. Worku, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 16/534,137

(22) Filed: Aug. 7, 2019

(65) Prior Publication Data
US 2020/0343731 A1  Oct. 29, 2020

Related U.S. Application Data

(60) Provisional application No. 62/838,619, filed on Apr. 25, 2019.

(51) Int. Cl.
*H02J 3/46* (2006.01)
*H02J 13/00* (2006.01)
(Continued)

(52) U.S. Cl.
CPC .............. *H02J 3/46* (2013.01); *G05B 19/042* (2013.01); *H02J 3/381* (2013.01);
(Continued)

(58) Field of Classification Search
CPC .......... H02J 3/46; H02J 13/0013; H02J 3/381; G05B 19/042; G05B 2219/2639; H02M 7/537; H03L 7/08
See application file for complete search history.

(56) References Cited

U.S. PATENT DOCUMENTS 8,606,424 B2 * 12/2013  Abido ...................... H02J 3/38
                                                          700/297
8,848,399 B2 *  9/2014  Sagneri ............... H02M 1/4241
                                                          363/21.02
(Continued)

FOREIGN PATENT DOCUMENTS

CN          101697420 A       4/2010
CN          102842921 B       7/2014

OTHER PUBLICATIONS

Mohamed A. Hassan, et al., "Optimal Design and Real Time Implementation of Autonomous Microgrid Including Active Load", Energies, vol. 11, Issue 5, May 2018, pp. 1-16.

(Continued)

*Primary Examiner* — Charles R Kasenge
(74) *Attorney, Agent, or Firm* — Oblon, McClelland, Maier & Neustadt, L.L.P.

(57) ABSTRACT

A method for improving an autonomous microgrid, and an autonomous microgrid that includes a plurality of inverter-based distributed generations. Each of the inverter-based distributed generations is coupled to a corresponding power droop controller, a corresponding voltage controller, and a corresponding current controller. The autonomous microgrid further includes a constant power load (CPL) coupled to one of the plurality of inverted-based distributed generations. The CPL includes a phase locked loop (PLL), a DC voltage controller and an AC current controller. Power-sharing coefficients, controller parameters of the controllers and gains of the PLL are defined based on a weighted objective function that is calculated through on a particle swarm optimization.

11 Claims, 27 Drawing Sheets

(51) Int. Cl.
*H02J 3/38* (2006.01)
*H02M 7/537* (2006.01)
*G05B 19/042* (2006.01)
*H03L 7/08* (2006.01)

(52) U.S. Cl.
CPC ......... *H02J 13/0013* (2013.01); *H02M 7/537* (2013.01); *G05B 2219/2639* (2013.01); *H03L 7/08* (2013.01)

(56) References Cited

U.S. PATENT DOCUMENTS

| | | | | |
|---|---|---|---|---|
| 9,184,660 B2* | 11/2015 | Sagneri | ................ | H02M 3/285 |
| 9,318,958 B2* | 4/2016 | Sagneri | ............... | H02M 3/1584 |
| 9,401,646 B2* | 7/2016 | Sagneri | ............ | H02M 3/33592 |
| 10,756,570 B2* | 8/2020 | Lundstrom | ............... | H02J 3/14 |
| 2012/0206943 A1* | 8/2012 | Sagneri | ................ | H02M 3/158 |
| | | | | 363/21.02 |
| 2012/0206946 A1* | 8/2012 | Sagneri | ................ | H02M 3/285 |
| | | | | 363/68 |
| 2012/0217938 A1* | 8/2012 | Sagneri | ................ | H02M 3/285 |
| | | | | 323/205 |
| 2012/0259477 A1* | 10/2012 | Abido | ....................... | H02J 3/38 |
| | | | | 700/297 |
| 2013/0073109 A1 | 3/2013 | Cheng et al. | | |
| 2015/0200601 A1* | 7/2015 | Sagneri | ............... | H02M 3/1584 |
| | | | | 363/21.14 |
| 2015/0263627 A1* | 9/2015 | Sagneri | ................ | H02M 1/42 |
| | | | | 363/21.02 |
| 2019/0280521 A1* | 9/2019 | Lundstrom | ....... | H02J 13/00007 |
| 2020/0067423 A1* | 2/2020 | Maksimovic | ............ | H02M 7/49 |

OTHER PUBLICATIONS

Nathaniel Bottrell, et al., "Dynamic Stability of a Microgrid with art Active Load", IEEE Transactions on Power Electronics, vol. 28, Issue 11, Nov. 2013, pp. 1-22.

* cited by examiner

METHOD FOR STABILIZING AN AUTONOMOUS MICROGRID INCLUDING AN ACTIVE LOAD

RELATED APPLICATIONS

This application claims priority to U.S. Provisional Application 62/838,619, filed on Apr. 25, 2019, which is incorporated herein by reference.

STATEMENT OF ACKNOWLEDGEMENT

The author would like to acknowledge the financial support provided by the Deanship of Scientific Research, King Fahd University of Petroleum and Minerals through project #RG171002.

STATEMENT OF PRIOR DISCLOSURE BY AN INVENTOR

Method for optimizing an autonomous microgrid including an active load was described by Mohamed A. Hassan, Muhammed Y. Worku and Mohamed A. Abido in "Optimal design and real time implementation of autonomous microgrid including active load", Energies 2018, 11(5), 1109, published on May 1, 2018, which is incorporated herein by reference in its entirety.

BACKGROUND

Technical Field

The present disclosure is directed to an optimal design and real time implementation of an autonomous microgrid including an active load.

Description of the Related Art

Nowadays, different distributed generation (DG) resources, such as wind and photovoltaic arrays (PVs), are being rapidly connected in the utility grid to overcome environmental problems and reduce global warming gas emissions (see Colmenar-Santos, A.; Reino-Rio, C.; Borge-Diez, D.; Collado-Fernindez, E. Distributed generation: A review of factors that can contribute most to achieve a scenario of DG units embedded in the new distribution networks. Renew. Sustain. Energy Rev. 2016, 59, 1130-1148, incorporated herein by reference in its entirety). To operate a microgrid at the distribution level, constant impedance loads (CILs) and constant power loads (CPLs) are connected with DGs (See Hatziargyriou, N. Microgrids: Architectures and Control; John Wiley & Sons: Chichester, UK, 2013; Hassan, M.; Abido, M. Optimal design of microgrids in autonomous and grid-connected modes using particle swarm optimization. IEEE Trans. Power Electron. 2011, 26, 755-769; Raju, E.; Jain, T. Robust optimal centralized controller to mitigate the small signal instability in an islanded inverter based microgrid with active and passive loads. Electr. Power Energy Syst. 2017, 90, 225-236; Han, H.; Hou, X.; Yang, J.; Wu, J.; Su, M.; Guerrero, J. M. Review of power sharing control strategies for islanding operation of ac microgrids. IEEE Trans. Smart Grid 2016, 7, 200-215; Chandorkar, M.; Divan, D.; Adapa, R. Control of parallel-connected inverters in standalone ac supply systems. IEEE Trans. Ind Appl. 1993, 29, 136-143; Olivares, D.; Mehrizi-Sani, A.; Etemadi, A. H.; Cafiizares, C. A.; Iravani, R.; Kazerani, M.; Hajimiragha, A. H.; Gomis-Bellmunt, O.; Saeedifard, M.; Palma-Behnke, R.; et al. Trends in microgrid control. IEEE Trans. Smart Grid 2014, 5, 1905-1919; Tsikalakis, A.; Hatziargyriou, N. Centralized control for optimizing microgrids operation. In Proceedings of the IEEE Power and Energy Society General Meeting, San Diego, Calif., USA, 24-29 Jul. 2011; Tan, K.; Peng, X.; So, P.; Chu, Y.; Chen, M. Centralized control for parallel operation of distributed generation inverters in microgrids. IEEE Trans. Smart Grid 2012, 3, 1977-1987; Liang, H.; Choi, B. J.; Zhuang, W.; Shen, X. Stability enhancement of decentralized inverter control through wireless communications in microgrids. IEEE Trans. Smart Grid 2013, 4, 321-331; Wang, Y.; Wang, X.; Chen, Z.; Blaabjerg, F. Distributed optimal control of reactive power and voltage in islanded microgrids. IEEE Trans. Ind Appl. 2017, 53, 340-349; Bottrell, N.; Prodanovic, M.; Green, T. Dynamic stability of a microgrid with an active load. IEEE Trans. Power Electron. 2013, 28, 5107-5119; He, J.; Li, Y. An enhanced microgrid load demand sharing strategy. IEEE Trans. Power Electron. 2017, 27, 3984-3995; and Guerrero, J.; Loh, P.; Chandorkar, M. Advanced control architectures for intelligent microgrids—Part I: Decentralized and hierarchical control. IEEE Trans. Ind. Electron. 2013, 60, 1254-1262, each incorporated herein by reference in their entirety).

For inverter-based microgrids, stability analysis is one of the most important concerns (see Raju, E.; Jain, T. Robust optimal centralized controller to mitigate the small signal instability in an islanded inverter based microgrid with active and passive loads. Electr. Power Energy Syst. 2017, 90, 225-236; Han, H.; Hou, X.; Yang, J.; Wu, J.; Su, M.; Guerrero, J. M. Review of power sharing control strategies for islanding operation of ac microgrids. IEEE Trans. Smart Grid 2016, 7, 200-215; Chandorkar, M.; Divan, D.; Adapa, R. Control of parallel-connected inverters in standalone ac supply systems. IEEE Trans. Ind. Appl. 1993, 29, 136-143; Olivares, D.; Mehrizi-Sani, A.; Etemadi, A. H.; Caiiizares, C. A.; lravani, R.; Kazerani, M.; Hajimiragha, A. H.; Gomis-Bellmunt, O.; Saeedifard, M.; Palma-Behnke, R.; et al. Trends in microgrid control. IEEE Trans. Smart Grid 2014, 5, 1905-1919; Tsikalakis, A.; Hatziargyriou, N. Centralized control for optimizing microgrids operation, In Proceedings of the IEEE Power and Energy Society General Meeting, San Diego, Calif., USA, 24-29 Jul. 2011, each incorporated herein by reference in their entirety).

In an autonomous microgrid, achieving accurate power-sharing while regulating the magnitude and the frequency of the microgrid is the main objective of DG control (see Raju, E.; Jain, T. Robust optimal centralized controller to mitigate the small signal instability in an islanded inverter based microgrid with active and passive loads. Electr. Power Energy Syst. 2017, 90, 225-236). For enhancing and improving a microgrid dynamic performance, related examples have used different centralized and decentralized control schemes (see Tsikalakis, A.; Hatziargyriou, N. Centralized control for optimizing microgrids operation. In Proceedings of the IEEE Power and Energy Society General Meeting, San Diego, Calif., USA, 24-29 Jul. 2011; Tan, K.; Peng, X.; So, P.; Chu, Y.; Chen, M. Centralized control for parallel operation of distributed generation inverters in microgrids. IEEE Trans. Smart Grid 2012, 3, 1977-1987; Liang, H.; Choi, B. J.; Zhuang, W.; Shen, X. Stability enhancement of decentralized inverter control through wireless communications in microgrids. IEEE Trans. Smart Grid 2013, 4, 321-331; Wang, Y.; Wang, X.; Chen, Z.; Blaabjerg, F. Distributed optimal control of reactive power and voltage in islanded microgrids. IEEE Trans. Ind. Appl. 2017, 53, 340-349; Bottrell, N.; Prodanovic, M.; Green, T. Dynamic stability of a microgrid with an active load. IEEE Trans. Power Electron. 2013, 28, 5107-5119).

The advantages and disadvantages of these schemes have been addressed in Tsikalakis et al. (see Tsikalakis, A.; Hatziargyriou, N. Centralized control for optimizing microgrids operation. In Proceedings of the IEEE Power and Energy Society General Meeting, San Diego, Calif., USA, 24-29 Jul. 2011). Different centralized control schemes to coordinate between parallel multiple inverters and to maximize the DGs productions and power exchanges of a microgrid with the main grid have been disclosed (see Tsikalakis, A.; Hatziargyriou, N. Centralized control for optimizing microgrids operation. In Proceedings of the IEEE Power and Energy Society General Meeting, San Diego, Calif., USA, 24-29 Jul. 2011; Tan, K.; Peng, X.; So, P.; Chu, Y.; Chen, M. Centralized control for parallel operation of distributed generation inverters in microgrids. IEEE Trans. Smart Grid 2012, 3, 1977-1987).

It is impractical and costly to maintain a communication link when using centralized control in remote areas with long distances between inverters (see Tan, K.; Peng, X.; So, P.; Chu, Y.; Chen, M. Centralized control for parallel operation of distributed generation inverters in microgrids. IEEE Trans. Smart Grid 2012, 3, 1977-1987). Therefore, decentralized schemes are used to avoid the communication link cost (see Liang, H.; Choi, B. J.; Zhuang, W.; Shen, X. Stability enhancement of decentralized inverter control through wireless communications in microgrids. IEEE Trans. Smart Grid 2013, 4, 321-331; Wang, Y.; Wang, X.; Chen, Z.; Blaabjerg, F. Distributed optimal control of reactive power and voltage in islanded microgrids. IEEE Trans. Ind. Appl. 2017, 53, 340-349).

These schemes are mostly based on the droop concept. Through droop control, emulating synchronous generators, sharing powers between inverter-based DGs was firstly proposed (see Chandorkar, M.; Divan, D.; Adapa, R. Control of parallel-connected inverters in standalone ac supply systems. IEEE Trans. Ind. Appl. 1993, 29, 136-143). Droop control schemes offer many advantages such as flexibility, redundancy, and expandability and can be categorized in four main groups: (1) conventional and variants of the droop control (see Chandorkar, M.; Divan, D.; Adapa, R. Control of parallel-connected inverters in standalone ac supply systems. IEEE Trans. Ind. Appl. 1993, 29, 136-143; He, J.; Li, Y. An enhanced microgrid load demand sharing strategy. IEEE Trans. Power Electron. 2017, 27, 3984-3995), (2) virtual framework structure-based methods (see Guerrero, J.; Loh, P.; Chandorkar, M. Advanced control architectures for intelligent microgrids—Part I:Decentralized and hierarchical control. IEEE Trans. Ind. Electron. 2013, 60, 1254-1262; He, J.; Li, Y.; Guerrero, J. An islanding microgrid power sharing approach using enhanced virtual impedance control scheme. IEEE Trans. Power Electron. 2013, 28, 5272-5282), (3) "construct and compensate" based methods (see Zhong, Q. Robust droop controller for accurate proportional load sharing among inverters operated in parallel. IEEE Trans. Ind. Electron. 2013, 60, 1281-1290; Lee, C.; Chu, C.; Cheng, P. A new droop control method for the autonomous operation of distributed energy resource interface converters. IEEE Trans. Power Electron. 2013, 28, 1980-1993); and (4) the hybrid droop/signal injection methods (see Perreault, D.; Selders, R., Jr.; Kassakian, J. Frequency based current-sharing techniques for paralleled power converters. IEEE Trans. Power Electron. 1988, 13, 626-634; Tuladhar, A.; Jin, H.; Unger, T. Control of parallel inverters in distributed AC power systems with consideration of line impedance effect. IEEE Trans. Ind. Appl. 2000, 36, 131-138).

The details and characteristics of various control schemes were illustrated in Han et al. (see Han, H.; Hou, X.; Yang, J.; Wu, J.; Su, M.; Guerrero, J. M. Review of power sharing control strategies for islanding operation of ac microgrids. IEEE Trans. Smart Grid 2016, 7, 200-215). Another updated revision for power-sharing schemes was presented in Han et al. (see Han, Y.; Li, H.; Shen, P.; Coelho, E.; Guerrero, J. Review of active and reactive power sharing strategies in hierarchical controlled microgrids. IEEE Trans. Power Electron. 2017, 32, 2427-2451, incorporated herein by reference in its entirety). It was stated that load demand and the controller power-sharing coefficients dominantly distress the low frequency modes; while filter parameters, load dynamics, and the controller parameters of the inner voltage and outer current controllers distress the medium and high frequency damped modes (see Han, H.; Hou, X.; Yang, J.; Wu, J.; Su, M.; Guerrero, J. M. Review of power sharing control strategies for islanding operation of ac microgrids. IEEE Trans. Smart Grid 2016, 7, 200-215). Moreover, constant load perturbation and load dynamics significantly distress microgrid stability (see Hassan, M.; Abido, M. Optimal design of microgrids in autonomous and grid-connected modes using particle swarm optimization. IEEE Trans. Power Electron. 2011, 26, 755-769, Emadi, A.; Khaligh, A.; Rivetta, C.; Williamson, G. Constant power loads and negative impedance instability in automotive systems: Definition, modeling, stability, and control of power electronic converters and motor drives. *IEEE Trans. Veh. Technol.* 2006, 55, 1112-1125, each incorporated herein by reference in their entirety).

Considering CPLs and/or CILs, it is essential to understand microgrid dynamic behavior (see Sanchez, S.; Ortega, R.; Grino, R.; Bergna, G.; Molinas, M. Conditions for existence of equilibria of systems with constant power loads. *IEEE Trans. Circuits Syst. I Regul. Pap.* 2014, 61, 2204-2211, incorporated herein by reference in its entirety). With similar frequency ranges, the control loop dynamic of the inverter and negative incremental resistance are the main characteristics of the CPLs (see Bottrell, N.; Prodanovic, M.; Green, T. Dynamic stability of a microgrid with an active load. IEEE Trans. Power Electron. 2013, 28, 5107-5119). These properties reduce system damping especially when CPL consumes a significant portion of the power (see Hassan, M. Dynamic Stability of an Autonomous Microgrid Considering Active Load Impact with New Dedicated Synchronization Scheme. *IEEE Trans. Power Syst.* 2018, 1-12, incorporated herein by reference in its entirety). Behind that, active loads need to be synchronized with the microgrid. Phase locked loop (PLL) is used for synchronization (see Dong, D.; Wen, B.; Boroyevich, D.; Mattavelli, P.; Xue, Y. Analysis of phase-locked loop low-frequency stability in three-phase grid-connected power converters considering impedance interactions. *IEEE Trans. Ind. Electron.* 2015, 62, 310-321; and Svensson, J. Synchronization methods for grid-connected voltage source converters. *IEE Proc. Gener. Transm. Distrib.* 2001, 148, 229-235, each incorporated herein by reference in its entirety).

Difficult tuning of the PLL parameters and its negative effect on controller performance are the main PLL drawbacks (see Dong, D.; Wen, B.; Boroyevich, D.; Mattavelli, P.; Xue, Y. Analysis of phase-locked loop low-frequency stability in three-phase grid-connected power converters considering impedance interactions. IEEE Trans. Ind. Electron. 2015, 62, 310-321).

Moreover, the coupling effect and interactions between the PLL itself and the system impedance lead to a potential instability issue (see Svensson, J. Synchronization methods for grid-connected voltage source converters. *IEE Proc. Gener. Transm. Distrib.* 2001, 148, 229-235). Studying microgrid stability considering CPLs is very important (see Chen, J.; Chen, J. Stability analysis and parameters optimization of islanded microgrid with both ideal and dynamic constant power loads. *IEEE Trans. Ind Electron.* 2018, 65, 3263-3274; Mahmoudi, A.; Hosseinian, S.; Kosari, M.; Zarabadipour, H. A new linear model for active loads in islanded inverter-based microgrid. *Int. J. Elecar. Power Energy Syst.* 2016, 81, 104-113; Magne, P.; Nahid-Mobarakeh, B.; Pierfederci, S. Dynamic consideration of dc microgrids with constant power loads and active damping system; a design method for fault-tolerant stabilizing system. *IEEE. J. Emerg. Sel. Top. Power Electron.* 2014, 2, 562-570; Marx, D.; Magne, P.; Nahid-Mobarakeh, B.; Pierfederici, S.; Davat, B. Large signal stability analysis tools in dc power systems with constant power loads and variable power loads—A review. *IEEE Trans. Power Electron.* 2012, 27, 1773-1787; Du, W.; Zhang, J.; Zhang, Y.; Qian, Z. Stability criterion for cascaded system with constant power load. *IEEE Trans. Power Electron.* 2013, 28, 1843-1851; and Karimipour, D.; Salmasi, F. Stability Analysis of AC Microgrids with Constant Power Loads Based on Popov's Absolute Stability Criterion. *IEEE Trans. Circuits Syst.* 1 2015, 62, 696-700, each incorporated herein by reference in their entirety).

Large-signal study has been used to explore microgrid stability with CPL (see Marx, D.; Magne, P.; Nahid-Mobarakeh, B.; Pierfederici, S.; Davat, B. Large signal stability analysis tools in dc power systems with constant power loads and variable power loads—A review. *IEEE Trans. Power Electron.* 2012, 27, 1773-1787; Du, W.; Zhang, J.; Zhang, Y.; Qian, Z. Stability criterion for cascaded system with constant power load. *IEEE Trans. Power Electron.* 2013, 28, 1843-1851; and Karimipour, D.; Salmasi, F. Stability Analysis of AC Microgrids with Constant Power Loads Based on Popov's Absolute Stability Criterion. *IEEE Trans. Circuits Syst. II* 2015, 62, 696-700, each incorporated herein by reference in their entirety).

A traditional Proportional Integral (PI) controller has been extensively used to control DG inverters (see Marx, D.; Magne, P.; Nahid-Mobarakeh, B.; Pierfederici, S.; Davat, B. Large signal stability analysis tools in dc power systems with constant power loads and variable power loads-A review. *IEEE Trans. Power Electron.* 2012, 27, 1773-1787). Many studies show that fixed-gain PI controllers cannot easily acclimate to load changes and disturbances, especially in large microgrids (see Du, W.; Zhang, J.; Zhang, Y.; Qian, Z. Stability criterion for cascaded system with constant power load. *IEEE Trans. Power Electron.* 2013, 28, 1843-1851). Trial-and-error-based studies have significant drawbacks such as difficulties in setting optimal parameters and being time-consuming (see Bottrell, N.; Prodanovic, M.; Green, T. Dynamic stability of a microgrid with an active load. IEEE Trans. Power Electron. 2013, 28, 5107-5119; Guo, X.; Lu, Z.; Wang, B.; Sun, X.; Wang, L.; Guerrero, J. Dynamic phasors-based modeling and stability analysis of droop-controlled inverters for microgrid applications. *IEEE Trans. Smart Grid* 2014, 5, 2980-2987; and Khorramabadi, S.; Bakhshai, A. Critic-based self-tuning PI structure for active and reactive power control of VSCs in microgrid systems. *IEEE Trans. Smart Grid* 2015, 6, 92-103, each incorporated herein by reference in their entirety).

In Bottrell et al. (see Bottrell, N.; Prodanovic, M.; Green, T. Dynamic stability of a microgrid with an active load. IEEE Trans. Power Electron. 2013, 28, 5107-5119), an analysis revealed that when the active load DC-voltage controller is designed with large gains, the voltage controller of the inverter becomes unstable. In addition, the controller design problem cannot be solved systematically. Recently, different computational intelligence techniques, like particle swarm optimization (PSO), have been used for different power system problems with impressive results (see Moafi, M.; Marzband, M.; Savaghebi, M.; Gucrrero, J. Energy management system based on fuzzy fractional order PID controller for transient stability improvement in microgrids with energy storage. *Int. Trans. Electr. Energy Syst.* 2016, 26, 2087-2106, incorporated herein by reference in its entirety). Although, complexity of the control system can be increased with these algorithms, PSO advantages, such as computational efficiency, simplicity, and robustness, can enhance the microgrid transient performance (see Hassan, M.; Abido, M. Optimal design of microgrids in autonomous and grid-connected modes using particle swarm optimization. IEEE Trans. Power Electron. 2011, 26, 755-769; Kennedy, J.; Eberhart, R. Particle swarm optimization. In Proceedings of the IEEE International Conference on Neural Networks, Perth, Western Australia, 27 Nov.-1 Dec. 1995; Volume 4, pp. 1942-1948; and Abido, M. Optimal design of power-system stabilizers using particle swarm optimization. *IEEE Trans. Energy Convers.* 2002, 17, 406-413, each incorporated herein by reference in their entirety).

To study and analyze power system dynamics, offline simulation such as MATLAB is not enough especially if power converters with high switching frequency are included. Nowadays, real time digital simulator (RTDS) that offer many advantages like well-established real time simulation, fast, reliable, accurate, and cost effective study of complex power systems are used for prototyping and hardware-in loop testing (see *Real Time Digital Simulator Power System and Control User Manual*; RTDS Technologies: Winnipeg, MB, Canada, 2009, incorporated herein by reference in its entirety). For example, microgrid test beds have been implemented in the laboratory to study control strategies, unbalanced problems, and optimal structures of distributed generation microgrids (see Forsyth, P.; Kuffel, R. Utility applications of a RTDS simulator. In Proceedings of the IPEC International Power Engineering Conference, Singapore, 3-6 Dec. 2007; pp. 112-117; and Li, Y.; Vilathgamuwa, D.; Loh, P. Design, analysis, and real-time testing of a controller for multibus microgrid system. *IEEE Trans. Power Electron.* 2004, 19, 1195-1204, each incorporated herein by reference in their entirety).

Irrespective of the aforementioned methods and strategies there is still a need for methods and strategies for stabilizing microgrid arrays, especially those having variable and active loads. Therefore, one objective of the present disclosure is to provide a method and system to improve the microgrid dynamic stability considering an active load. Current, voltage, and power controllers can be used to control the voltage and current of inverter-based DGs and to share the DGs output powers. Additionally, ac current and dc voltage of the active load can be controlled by using two PI controllers. The method and system of the present disclosure reduce degradation of the dynamic performance of the microgrid considering the active load. In addition, the method and system of the present disclosure may be used to investigate microgrid stability including the active load using heuristic techniques such as PSO.

SUMMARY

Controller gains and power-sharing parameters are the main parameters that affect the dynamic performance of a microgrid. Considering an active load to the autonomous microgrid, the stability problem can be more involved. In the present disclosure, the active load effect on microgrid dynamic stability is accounted. An autonomous microgrid including three inverter-based distributed generations (DGs) with an active load was modeled and the associated controllers are disclosed. Controller gains of the inverters of the autonomous microgrid and active load as well as Phase Locked Loop (PLL) parameters were tuned to guarantee overall system stability. A weighted objective function is proposed to minimize the error in both measured active power and DC voltage based on time-domain simulations. Different AC and DC disturbances were applied to verify and assess the effectiveness of the proposed control strategy. The results demonstrate the effectiveness of the presently disclosed controller to enhance microgrid stability and to provide efficient damping characteristics. Additionally, the presently disclosed method, system and controller were compared with related examples to demonstrate superiority. Moreover, the microgrid considered has been established and implemented on real time digital simulator (RTDS). The experimental results validate the simulation results and prove the effectiveness of the proposed controllers to improve the stability of the microgrid.

According to an aspect of the disclosure, a method for improving an autonomous microgrid is provided. In the disclosed method, the autonomous microgrid is formed. The autonomous microgrid includes a plurality of inverted-based distributed generations. Each of the inverted-based distributed generation further includes a corresponding power droop controller configured to share an output power of the respective plurality of inverted-based distribution generations in the autonomous microgrid, a corresponding voltage controller configured to control an output voltage of the respective inverted-based distributed generation, and a corresponding current controller configured to control an output current of the respective inverted-based distributed generation. The autonomous microgrid also includes a constant power load (CPL) coupled to one of the plurality of inverted-based distributed generations. The CPL includes a phase locked loop (PLL) configured to synchronize the constant power load with the microgrid, a DC voltage controller configured to control a DC voltage of the constant power load, and an AC current controller configured to control an AC current of the constant power load. Further, in the disclosed method, system parameters of the autonomous microgrid are defined based on a weighted objective function that is calculated through on a particle swarm optimization.

In some embodiments, the weighted objective function comprises:

minimize $J$, subject to $\{K^{min} \leq K \leq K^{max}, m_p^{min} \leq m_p \leq m_p^{max}, \text{ and } n_q^{min} \leq n_q \leq n_q^{max}\}$, where $J = \int_{t=0}^{t=tsim} [(P_m - P_{ref})^2 + (V_{dc} - V^*_{dc})^2] t \, dt$, and where $J$ is the weighted objective function, $K = [k_{pv}, k_{iv}, k_{pc}, k_{ic}, k_{pv\_AL}, k_{iv\_AL}, k_{pc\_AL}, k_{ic\_AL}, k_p^{PLL}, k_I^{PLL}]^T$ are controller parameters that are constrained as $K^{min} \leq K \leq K^{max}$, $m_p$ and $n_q$ are power-sharing parameters, $t$ is a minimum settling time, $P_{ref}$ is a reference active power of the plurality of the inverted-based distribution generations and $V^*_{dc}$ is DC reference voltage.

In the disclosed method, defining the system parameters of the autonomous microgrid includes defining the power-sharing coefficients associated with the plurality of the inverted-based distribution generations, the controller parameters of the power droop controllers, the voltage controllers, and the current controllers are defined based on the weighted objective function that is calculated through on the particle swarm optimization. In addition, the gains of the phase locked loop, the controller parameters of the dc voltage controller, and the ac current controller are defined based on the weighted objective function that is calculated through on the particle swarm optimization.

The autonomous microgrid can further include a constant impedance load (CIL) that is coupled to another one of the plurality of inverted-based distributed generations. The plurality of the inverted-based distribution generations can be serially connected. Every two adjacent inverted-based distribution generations can be serially connected via a respective transmission line and a respective coupling inductance. Each of the plurality of the inverted-based distribution generations is connected to one or more filters, and one or more coupling inductances. Each of the inverted-based distribution generations can include a respective power source and a respective inverter.

According to another aspect of the disclosure, an apparatus is provided. The apparatus has processing circuitry. The processing circuitry is configured to perform the disclosed method for improving the autonomous microgrid.

Aspects of the disclosure also provide a non-transitory computer-readable medium storing instructions which when executed by a computer cause the computer to perform the method mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The method and system of the present disclosure permit consideration and identification of all of the parameters that affect microgrid dynamic stability including the active load. In one aspect, by minimizing error deviations in the measured active power of a DG and the dc voltage of an active load, the control problem is solved.

Figure 1:
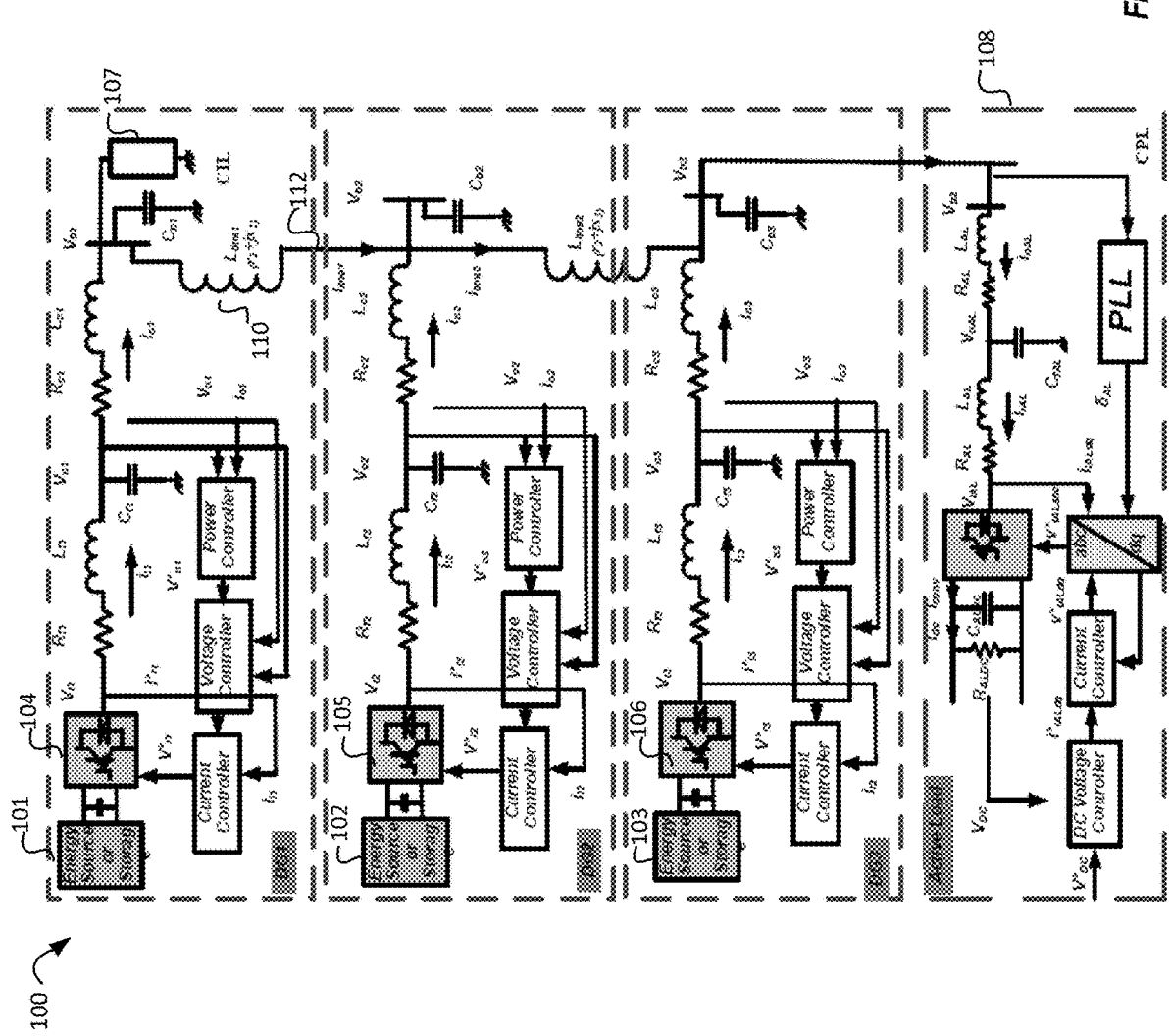
FIG. 1 is a schematic diagram of an exemplary microgrid with an active load, in accordance with some embodiments.

A microgrid mathematical model that includes an active load can be illustrated based on FIG. 1 (see Hassan, M.; Abido, M. Optimal design of microgrids in autonomous and grid-connected modes using particle swarm optimization. IEEE Trans. Power Electron. 2011, 26, 755-769; Bottrell, N.; Prodanovic, M.; Green, T. Dynamic stability of a microgrid with an active load. IEEE Trans. Power Electron., 2013, 28, 5107-5119—incorporated herein by reference).

FIG. 1 illustrates an autonomous microgrid 100. The autonomous microgrid 100 includes three-inverter 104-106 which are controlled to convert the generated DC power of the renewable sources 101-103 into AC power to feed two different loads (constant impedance load (CIL) 107 and constant power load (CPL) 108 through two transmission lines, filters and coupling inductances. The CIL 107 is connected to a bus line 112 through a transmission line 110.

Figure 2:
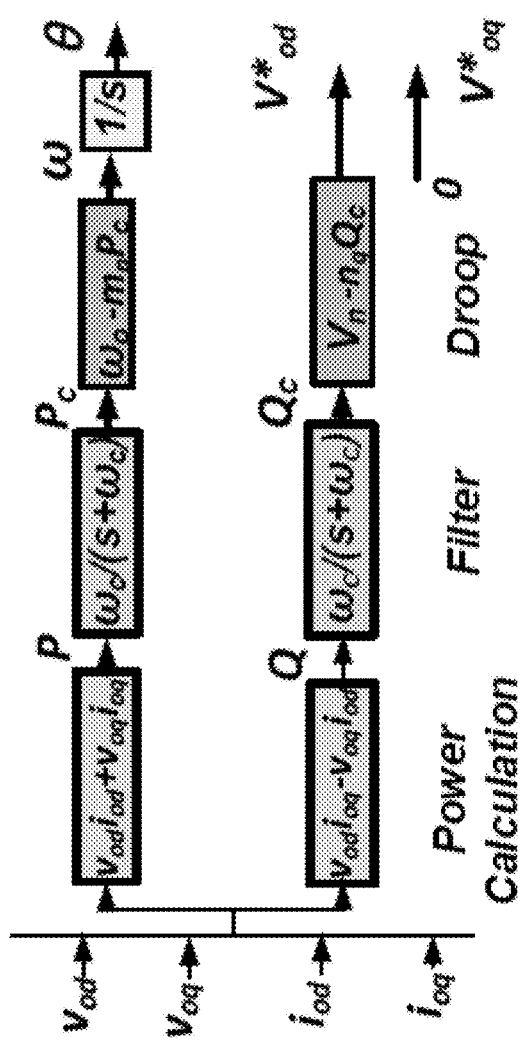
FIG. 2 is a schematic diagram of an exemplary power controller, in accordance with some embodiments.
Figure 3A:
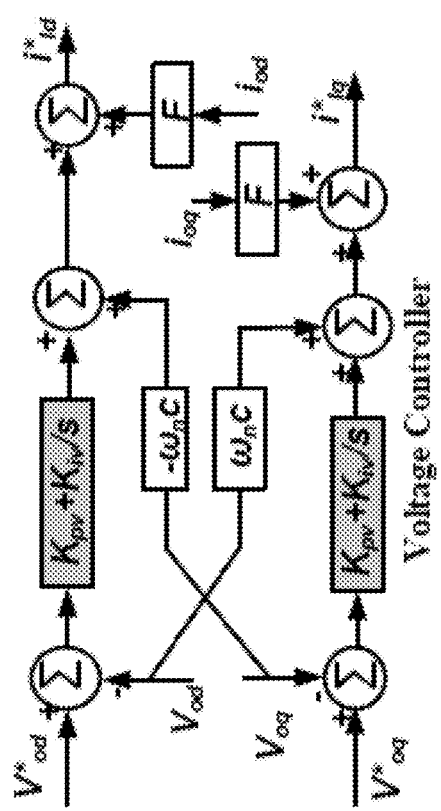
FIG. 3A is a schematic diagram of an exemplary voltage controller, in accordance with some embodiments.
Figure 3B:
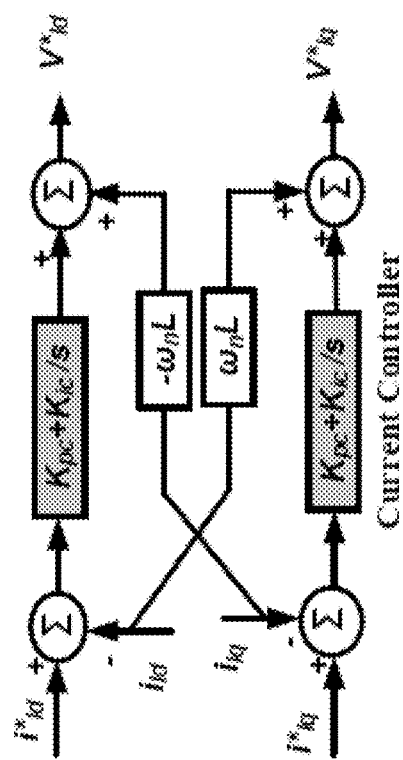
FIG. 3B is a schematic diagram of an exemplary current controller, in accordance with some embodiments.

The microgrid 100 can include a plurality of inverter-based distributed generations (DGs). For example, three DGs 1-3 are included in the microgrid 100. Each of the DGs includes an energy source and an inverter coupled to the energy source. For example, DG1 has an energy source 101 and an inverter 104. In the microgrid 100, a constant impedance load (CIL) 107 is coupled to one of the DGs, such as the DG1, and a constant power load (CPL) 108 is coupled to another one of the DGs, such as DG3 through transmission lines, filters formed by inductances and capacitors, and coupling inductances. In addition, each of the DGs can have three controllers which include a power controller, a voltage controller and a current controller. In an autonomous mode of the autonomous microgrid 100, feeding the load (e.g., CIL, CPL) with a predefined frequency and voltage values is a main objective. Therefore, the three controllers can be used to achieve such as goal. The three controllers are presented to control the three inverters of the DGs. Firstly, emulating a synchronous generator, the power controller is used to share the powers between DGs. The power controller is also referred to as power droop controller, and details of the power controller are illustrated in FIG. 2. Secondly, two PI controllers (i.e., the voltage controller and the current controller) are employed to control the DGs' output voltage and current that can be shown in FIGS. 3A and 3B. As shown in FIGS. 3A and 3B, $v_{od}$ and $v_{oq}$ are dq components of the inverter output voltage $v_o$. $i_{od}$ and $i_{oq}$ are dq components of the inverter output current $i_o$. $v^*_{od}$ and $v^*_{oq}$, are dq components of the reference output voltage. $i^*_{ld}$ and $i^*_{lq}$ are dq components of inductor reference current. $\omega_n$ is a nominal angular frequency of DG. $C_f$, $L_f$ and $R_f$ are capacitance, inductance and resistance of the LC filter respectively. $v^*_{id}$ and $v^*_{iq}$ are dq components of the reference inverter voltage. $k_{pv}$ and $k_{iv}$ are PI voltage controller parameters of the DG inverter. $k_{pc}$ and $k_{ic}$ are PI current controller parameters of the DG inverter.

It is worth mentioning that each of the DG inverters (e.g., 104) is assumed to be connected to a constant dc power source (e.g., 101), so there is no need to regulate the dc-link voltage. Otherwise, a controller may be introduced to regulate the dc-link voltage (see Hornik, T.; Zhong, Q. A Current-Control Strategy for Voltage-Source Inverters in Microgrids Based on H∞ and Repetitive Control. *IEEE Trans. Power Electron.* 2011, 26, 943-952, incorporated herein by reference in its entirety). The plurality of the inverted-based distribution generations can be connected in series, parallel, or series-parallel. FIG. 1 illustrates an exemplary connection of the DGs in series, where every two adjacent inverter-based distribution generations are serially connected via a respective transmission line and a respective coupling inductance. For example, DG1 and DG2 are serially connected through a transmission line 110 and a coupling inductance 112.

Still referring to FIG. 1, in an aspect of an autonomous microgrid, a dynamic performance of an ac side of an inverter-based DG (e.g., DG1) can be derived. An instantaneous real power ($P_m$) and an instantaneous reactive power ($Q_m$) can be obtained by using a measured output current ($i_o$), and a measured output voltage ($v_o$) as follows:

$$P_m = v_{od}i_{od} + v_{oq}i_{oq} \quad (1)$$

$$Q_m = v_{od}i_{oq} - v_{oq}i_{od} \quad (2)$$

where $v_{od}$ and $v_{oq}$ are dq components of the inverter output voltage $v_o$. $i_{od}$ and $i_{oq}$ are dq components of the inverter output current $i_o$. $P_m$ and $Q_m$ are instantaneous active and reactive powers.

An average real power Pc and a reactive power Qc are obtained in the s-domain using a low pass filter that is given in FIG. 2.

$$P_c = \frac{\omega_c}{\omega_c + s} P_m, \quad Q_c = \frac{\omega_c}{\omega_c + s} Q_m \quad (3)$$

where $\omega_c$ is a cut-off frequency of a low-pass filter.

FIG. 2 is a schematic diagram of an exemplary power controller, in accordance with some embodiments. In FIG. 2, $v_{od}$ and $v_{oq}$ dq are components of the inverter output voltage $v_o$. $i_{od}$ and $i_{oq}$ are dq components of the inverter output current $i_o$. $P_m$ and $Q_m$ are instantaneous active and reactive powers. $P_c$ and $Q_c$ are average active and reactive powers. $m_p$ and $n_q$ are droop controller gains. $\theta$ is a phase reference. $\omega$ is a nominal frequency. $\omega_c$ is a cut-off frequency of the low-pass filter. $\omega_n$ is a nominal angular frequency of DG. $V_n$ is a nominal magnitude of the DG voltage.

As shown in FIG. 2, a frequency m can be obtained from the average active power Pc while the d-axis reference voltage $v^*_{od}$ is obtained from the average reactive power Qc as $$\omega = \omega_n - m_p P_c, \hat{\theta} = \omega \quad (4)$$

$$v^*_{od} = V_n - n_q Q_c, v^*_{oq} = 0 \quad (5)$$

where $\omega_n$ is a nominal angular frequency of the DG, $V_n$ is a nominal magnitude of the DG voltage and $m_p$ and $n_q$ are gains of the power droop controller.

In addition, state equations of the voltage controller and the current controller can be shown as:

$$i^*_{ld} = Fi_{od} - \omega_n C_f v_{oq} + K_{pv}(v^*_{od} - v_{od}) + K_{iv} \int (v^*_{od} - v_{od})dt \quad (6)$$

$$i^*_{lq} = Fi_{oq} + \omega_n C_f v_{od} + K_{pv}(v^*_{oq} - v_{oq}) + K_{iv} \int (v^*_{oq} - v_{oq})dt$$

$$v^*_{id} = -\omega_n L_f i_{lq} + K_{pc}(i^*_{ld} - i_{ld}) + K_{ic} \int (i^*_{ld} - i_{ld})dt \quad (7)$$

$$v^*_{iq} = \omega_n L_f i_{ld} + K_{pc}(i^*_{lq} - i_{lq}) + K_{ic} \int (i^*_{lq} - i_{lq})dt$$

where $L_c$ and $r_c$ are inductance and resistance of the coupling inductance respectively, F is a feed-forward gain, $C_f$ is a filter capacitance, and $K_{pc}$, $K_{ic}$, $K_{pv}$, and $K_{iv}$ are controller parameters of the PI controllers (e.g., the voltage controller and the current controller).

State equations of the LC filter and coupling inductance can be written as $$\frac{di_{ld}}{dt} = -\frac{r_f}{L_f} i_{ld} + \omega i_{lq} + \frac{1}{L_f}(v_{id} - v_{od}) \quad (8)$$

$$\frac{di_{lq}}{dt} = -\frac{r_f}{L_f} i_{lq} - \omega i_{ld} + \frac{1}{L_f}(v_{iq} - v_{oq}) \quad (9)$$

$$\frac{dv_{od}}{dt} = \omega v_{oq} + \frac{1}{C_f}(i_{ld} - i_{od}) \quad (10)$$

$$\frac{dv_{oq}}{dt} = -\omega v_{od} + \frac{1}{C_f}(i_{lq} - i_{oq}) \quad (11)$$

$$\frac{di_{od}}{dt} = -\frac{r_c}{L_c} i_{od} + \omega i_{oq} + \frac{1}{L_c}(v_{od} - v_{bd}) \quad (12)$$

$$\frac{di_{oq}}{dt} = -\frac{r_c}{L_c} i_{oq} - \omega i_{od} + \frac{1}{L_c}(v_{oq} - v_{bq}) \quad (13)$$

It should be noted that the autonomous microgrid model mentioned above uses different frequency variables: $\omega$, $\omega_0$, $\omega_n$, and $\omega_{COM}$. The variable o denotes an arbitrary time varying frequency which can be used in Equations (8)-(13) to obtain a drop voltage in the coupling inductances. While a nominal system frequency denoted by $\omega_n$ is used to obtain reference values (Equations (6) and (7)). The other values denoted by $\omega_0$ and $\omega_{COM}$ are the value of the frequency at time zero and the common system reference frame frequency, respectively (see Hassan, M.; Abido, M. Optimal design of microgrids in autonomous and grid-connected modes using particle swarm optimization. IEEE Trans. Power Electron. 2011, 26, 755-769—incorporated herein by reference in its entirety).

Figure 4:
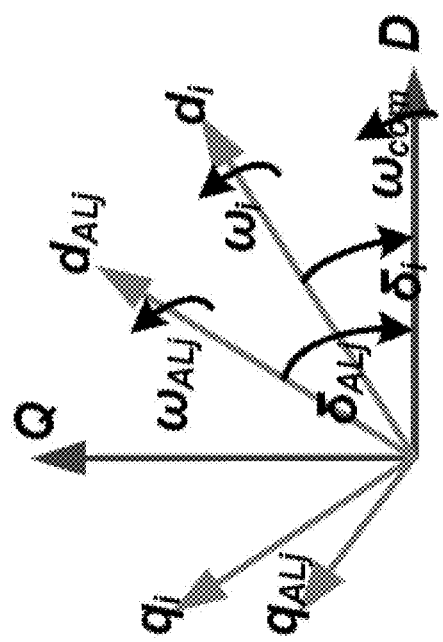
FIG. 4 illustrates an exemplary common reference frame (DQ), in accordance with some embodiments.

FIG. 4 illustrates an exemplary common reference frame (DQ), in accordance with some embodiments. In FIG. 4, $\omega$ is a nominal frequency. $\omega_{com}$ is a frequency of the common reference frame. $\omega_i$ is a frequency of the $i^{th}$ inverter. $\omega_{ALj}$ is a frequency of the $j^{th}$ active load. $\delta_i$ is an angle between the reference frame of each inverter (dq) and the common reference frame (DQ). $\delta_{AL}$ is an angle between the reference frame of active load ($dq_{AL}$) and the common reference frame (DQ).

As shown in FIG. 4, each of the DGs has to be modeled on its local rotating (dqi) reference frame, and then all DGs will have common reference frames (DQ). Therefore, all related DG voltages and currents can be represented on DQ as $$\frac{di_{lineDi}}{dt} = -\frac{r_{linei}}{L_{linei}} i_{lineDi} + \omega i_{lineQi} + \frac{1}{L_{linei}}(v_{bDj} - v_{bDk}) \quad (14)$$

$$\frac{di_{lineDi}}{dt} = -\frac{r_{linei}}{L_{linei}} i_{lineDi} - \omega i_{lineQi} + \frac{1}{L_{linei}}(v_{bQj} - v_{bQk}) \quad (15)$$

$$\frac{di_{loadDi}}{dt} = -\frac{R_{loadi}}{L_{loadi}} i_{loadDi} - \omega i_{loadDi} + \frac{1}{L_{loadi}} v_{bDi} \quad (16)$$

$$\frac{di_{loadQi}}{dt} = -\frac{R_{loadi}}{L_{loadi}} i_{loadQi} - \omega i_{loadDi} + \frac{1}{L_{loadi}} v_{bQi} \quad (17)$$

$$\frac{dv_{bDi}}{dt} = -\omega v_{bQi} + \frac{1}{C_f}(i_{oDi} - i_{loadDi} \pm i_{lineDi,j}) \quad (18)$$

$$\frac{dv_{bQi}}{dt} = -\omega v_{bDi} + \frac{1}{C_f}(i_{oQi} - i_{loadQi} \pm i_{lineQi,j}) \quad (19)$$

Figure 5:
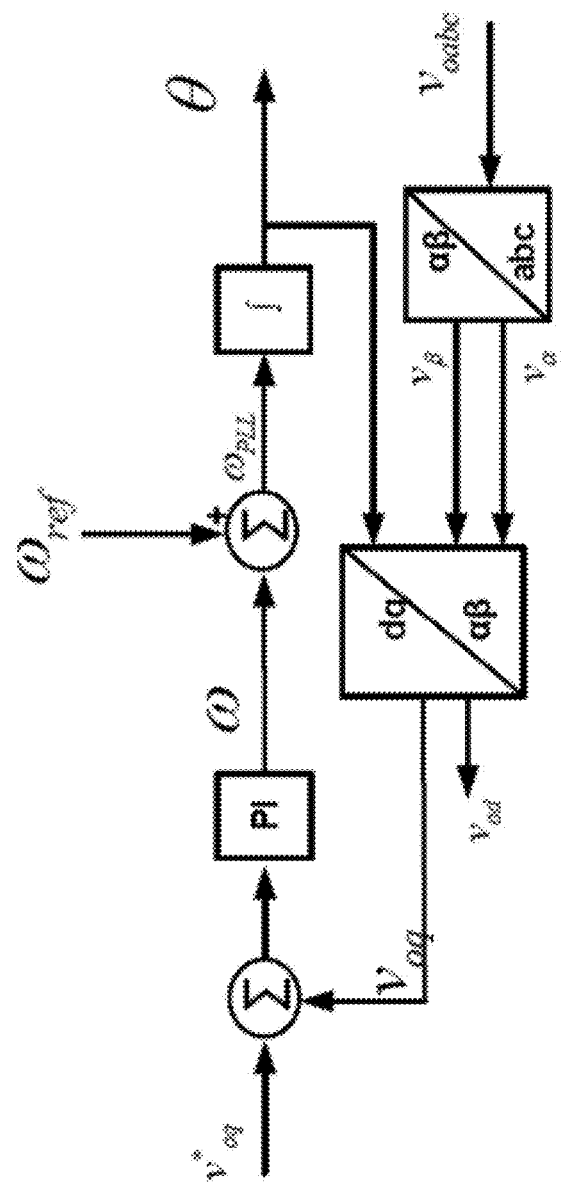
FIG. 5 is a schematic diagram of an exemplary phase locked loop, in accordance with some embodiments.

Still referring to FIG. 1, an active load model with its controllers can also be derived. In the active load model, the active load (e.g., CPL) has its own dq reference frame as each inverter of the DG has. The active load needs to be synchronized with the microgrid to share angles of the active load with the microgrid. A traditional PLL shown in FIG. 5 can be applied for this purpose. As shown in FIG. 5, $v_{od}$ and $v_{oq}$ are dq components of the inverter output voltage $v_o$. $v^*_{oq}$ is q components of the reference output voltage. θ is a phase reference. ω is a nominal frequency. $\omega_{ref}$ is a reference angular frequency of DG. $\omega_{pll}$ is an angular frequency of PLL.

The input variable of the active load model is the input voltage while the output variable is the current drawn from the DGs (see Bottrell, N.; Prodanovic, M.; Green, T. Dynamic stability of a microgrid with an active load. IEEE Trans. Power Electron. 2013, 28, 5107-5119—incorporated herein by reference in its entirety). The active load input current ($i_{lALDQ}$) is converted from the common reference frame "DQ" to the active load reference frame $dq_{AL}$ by using PLL.

$$[i_{lALDQ}] = [T_r][i_{lALdq}] \quad (20)$$

$$[T_R] = \sqrt{\frac{2}{3}} \begin{bmatrix} \cos(\delta_i) & -\sin(\delta_i) \\ \sin(\delta_i) & \cos(\delta_i) \end{bmatrix}$$

where $\delta_i$ is an angle between the dq active load frame and common reference frame DQ.

To set the dq system frequency equal to the microgrid frequency, the regulator is arranged to maintain one component at zero by changing the frequency of dq system rotation (see Chen, J.; Chen, J. Stability analysis and parameters optimization of islanded microgrid with both ideal and dynamic constant power loads. IEEE Trans. Ind. Electron. 2018, 65, 3263-3274—incorporated herein by reference in its entirety). The three-phase voltages are transformed into αβ stationary reference frame then the frequency and the inverter phase reference θ can be estimated as given in Equations (21) and (22). An angle θ is controlled to transform from abc to dq and vice versa.

$$\omega = k_p^{PLL}(v_{oq} - v^*_{oq}) + k_I^{PLL} \int (v_{oq} - v^*_{oq}) dt \quad (21)$$

$$\theta = \int (\omega - \omega_{ref}) dt + \theta(0) \quad (22)$$

where $k_p^{PLL}$ and $k_I^{PLL}$ are the PLL controller parameters.

Figure 6A:
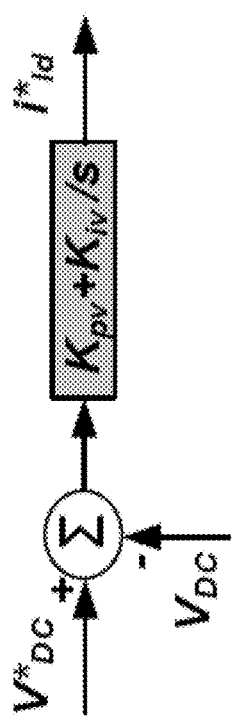
FIG. 6A is schematic diagram of an exemplary DC voltage controller, in accordance with some embodiments.
Figure 6B:
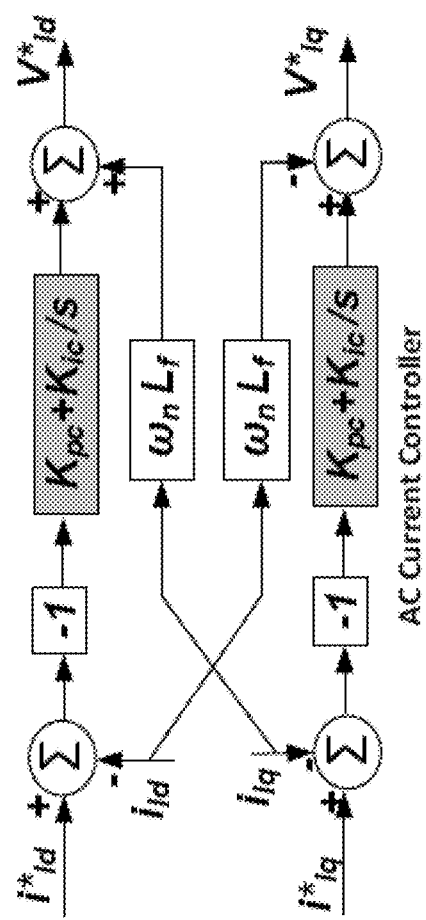
FIG. 6B is schematic diagram of an exemplary AC current controller, in accordance with some embodiments.

FIG. 6A is schematic diagram of an exemplary DC voltage controller. FIG. 6B is schematic diagram of an exemplary AC current controller. As shown in FIGS. 6A-6B, $V_{DC}$ is a DC voltage of the active load. $V^*_{DC}$ is a DC Reference voltage of the active load. $i^*_{ld}$ and $i^*_{lq}$ are dq components of inductor reference current. $V^*_{id}$ and $V^*_{iq}$ are dc components of the reference inverter voltage. $i_{ld}$ and $i_{lq}$ are dq components of the coupling inductor current $i_L$. $L_f$ is an inductance of the LC filter. $\omega_n$ is a nominal angular frequency of DG. $k_{pv}$ and $k_{iv}$ are PI voltage controller parameters of the DG inverter. $k_{pc}$ and $k_{ic}$ are PI current controller parameters of the DG inverter.

To regulate the DC voltage and control the AC current of the active load, two PI controllers are proposed, which are a DC voltage controller and an AC current controller. It should be noted that the PLL, the DC voltage controller and an AC current controller are also illustrated in FIG. 1 for the CPL. An equation (23) can be proposed to regulate the DC voltage and control the AC current of the active load:

$$i^*_{ldAL} = k_{pv\_AL}(v^*_{DC} - v_{DC}) + K_{iv\_AL} \int (v^*_{DC} - v_{DC}) dt \quad (23)$$

In equation (23), $V_{DC}$ is a DC voltage of the active load, $V^*_{DC}$ is a DC Reference voltage of the active load. $i_{ldAL}$ is a d component of the input current to the bridge ($i_{lAL}$). $k_{pv\_AL}$ and $k_{iv\_A}$ are PI controller parameters of the DC voltage of the active load. $k_{pc\_AL}$ and $k_{ic\_AL}$ are PI controller parameters of the AC current of the active load.

Tuning these controller parameters provides a reasonable steady-state response. Firstly, the voltage controller can be used to get an AC reference current by minimizing an error between the measured DC voltage and the DC reference voltage. Similarly, the current controller can be used to get an AC reference voltage by minimizing an error between the measured AC current and the AC reference current. A negative sign to the inverter current can be added to the voltage controller state-space equations because the active load is receiving current from the DGs. For decoupling the inductor current in the DQ axes, feed-forward terms can be involved as shown in FIGS. 6A-6B. Meanwhile, the state-space equations of the DC capacitor circuit can be given in Equations (24) and (25).

$$v^*_{idAL} = \quad (24)$$
$$\omega_{nAL} L_{fAL} i_{lqAL} - K_{pc\_AL}(i^*_{ldAL} - i_{ldAL}) - K_{ic\_AL} \int (i^*_{ldAL} - i_{ldAL}) dt$$

$$v^*_{iqAL} = \quad (25)$$
$$-\omega_{nAL} L_{fAL} i_{ldAL} - K_{pc\_AL}(i^*_{lqAL} - i_{lqAL}) - K_{ic\_AL} \int (i^*_{lqAL} - i_{lqAL}) dt$$

$$\frac{dv_{DC}}{dt} = \frac{1}{C_{dc}} i_{conv} - \frac{1}{R_{dc} C_{dc}} v_{DC}$$

where $C_{dc}$ and $R_{dc}$ are the dc load capacitance and resistance and $i_{conv}$ is the DC current of the active load.

Considering ideal power converter, the internal power losses can be neglected. Therefore, the state-space equations of the switching bridge can be written as $$v_{idAL} i_{ldAL} + v_{iqAL} i_{lqAL} = i_{conv} v_{DC} \quad (26)$$

In the microgrid 100 that is a component of the present disclosure, controller gains may cause poor damped responses and even the instability of the microgrid (see Hassan, M.; Abido, M. Optimal design of microgrids in autonomous and grid-connected modes using particle swarm optimization. IEEE Trans. Power Electron. 2011, 26, 755-769—incorporated herein by reference in its entirety). To enhance the microgrid transient performance, the controller parameters of inverters and active load, PLL gains, and power-sharing coefficients need to be tuned carefully. In the present disclosure, a method and system are used to obtain the parameters affecting the stability of the microgrid.

In the presently disclosed method, controller parameters and power-sharing coefficients are obtained based on time domain simulation. Problem constraints can be the parameter bounds. Therefore, the design problem can be formulated as the following equations:

$$\text{Minimize } J \quad (27)$$

$$\text{Subject to } \{K^{min} \leq K \leq K^{max}, m_p^{min} \leq m_p \leq m_p^{max}, \text{ and} \quad (28)$$
$$n_q^{min} \leq n_q \leq n_q^{max}\}$$

$$\text{where } J = \int_{t=0}^{t=tsim} [(P_m - P_{ref})^2 + (V_{dc} - V^*_{dc})^2] t dt \quad (29)$$

where J is a weighted objective function, $K = [k_{pv}, k_{iv}, k_{pc}, k_{ic}, k_{pv\_AL}, k_{iv\_AL}, k_{pc\_AL}, k_{ic\_AL}, k_p^{PLL}, k_I^{PLL}]_T$ are the controller parameters constrained as $K^{min} \leq K \leq K^{max}$, $m_p$ and $n_q$ are the power-sharing parameters, t is minimum settling time, $P_{ref}$ is the reference active power of the DG and $V^*_{dc}$ is DC reference voltage.

In order to obtain the desired controller parameters and improved power-sharing coefficients, the weighted object function J needs to be minimized to make sure that the DG inject the required active power and make sure that the dc voltage of the active load is close to the reference dc voltage. In the disclosed method, the weighted objective function can be calculated based on a Particle Swarm Optimization (PSO) to obtain a minimum weighted object function value. The PSO starts randomly assuming their particles, which are controller parameters in this work. Using these parameters, the weighted objective function (also referred to as cost function) J is calculated. The cost function J depends mainly on the variations of $P_{ref}$ and $V^*_{dc}$ as shown in Equation (29). The calculation step can be repeated and after each step, the cost function can be compared with a minimum calculated cost function until the coast function J arrives to a lowest cost function. The corresponding parameters to the lowest cost function can be defined as the improved controller parameters.

In the present disclosure, PSO is utilized to obtain improved parameters. Eberhart and Kennedy developed the PSO as a population based stochastic optimization method (see Kennedy, J.; Eberhart, R. Particle swarm optimization. In Proceedings of the IEEE International Conference on Neural Networks, Perth, Western Australia, 27 Nov.-1 Dec. 1995; Volume 4, pp. 1942-1948—incorporated herein by reference in its entirety).

It is worth mentioning that balancing between local and global search methods can be achieved using PSO. It has different advantages over other conventional techniques (see Hassan, M.; Abido, M. Optimal design of microgrids in autonomous and grid-connected modes using particle swarm optimization. IEEE Trans. Power Electron. 2011, 26, 755-769). In a PSO algorithm, the population has n particles that represent candidate solutions. Each particle is an m-dimensional real-valued vector, where m is the number of parameters. Therefore, each parameter represents a dimension of the problem space. The PSO can be summarized as follows:

(1) Initialization: starting by time counter setting, random n particles and their initial velocities can be generated. The objective function of each particle can be evaluated. From the obtained objective functions, the global best function $J_{best}$ can be selected as the lowest objective function. Meanwhile, its associated global best particle $x_{best}$ can be selected as well. To control the impact of the previous velocity on the current velocity, the inertia weight can be initiated.

(2) Time Updating: the time counter can be updated.

(3) Weight Updating: the inertia weight can be updated as follows $\omega(t)=\alpha\omega(t-1)$ where $\alpha$ is a decrement constant smaller than but close to 1.

(4) Velocity Updating: at each time step, each particle velocity is modified depending mostly on its current velocity and the distances between the particle and its personal and global best positions. The velocity updating can be shown in Equation (30).

$$v_{n+1}^i = \omega v_n^i + c_1 r_1 (p_{best} - k_n^i) + c_2 r_2 (g_{best} - k_n^i) \quad (30)$$

where $r_1$ and $r_2$ are random numbers between 0 and 1; w is the inertia weight; $c_1$ and $c_2$ are the 'trust' parameters; $g_{best}$ is the best swarm position; and $p_{best}$ is the best position for particle i.

It is worth mentioning that the second term of Equation (30) represents the cognitive part of PSO where the particle changes its velocity based on its own thinking and memory. The third term of Equation (30) represents the social part of PSO where the particle changes its velocity based on the social-psychological adaptation of knowledge. In previous research, a variety of inertia weight strategies were proposed and developed to improve the performance of the PSO algorithm. However, the random values for most modified PSO algorithms are always generated by uniform distribution in the range of [0, 1]. The random values represent the weights of two distances for updating the particle velocity. If the range of random values is small, these two distances have little influence on the new particle velocity, which means that the velocity cannot be effectively increased or changed to escape from local optima. In order to improve the global ability of the PSO algorithm, it is necessary to expand the range of random values (see Dai, H.-P.; Chen, D.-D.; Zheng, Z.-S. Effects of Random Values for Particle Swarm Optimization Algorithm. *Algorithms* 2018, 11, 23, incorporated herein by reference in its entirety).

(5) Position updating: based on the updated velocities, the new particle position at iteration n+1 is given as:

$$k_{n+1}^i = k_n^i + v_{n+1}^i \quad (31)$$

where $k_{n+1}^j$ and $v_{n+1}^j$ are the particle position and its velocity vector at iteration n+1.

(6) Individual Best Updating: for each particle, the cost function J can be determined according to the updated position and then it can be compared with the previous one. If this cost function at this time is less than the previous one, it will be selected as the global best $J^*_j$. An individual best can be also selected as a global best.

(7) Global Best Updating: from the all values of the global best $J^*_j$, the minimum value can be selected as follows: If $J_{min} > J^{}$ then update global best as $X^{} = X_{min}$ and $J^{**} = J_{min}$.

(8) Stopping Criteria: PSO can stop searching if the number of iterations exceeds pre-specified number or if the number of iterations exceeds the maximum allowable iterations.

The PSO can be implemented based on MATLAB. A MATLAB code can be built to emulate the proposed PSO to calculate the weighted objective function J. In some embodiments, PSO performance is mainly affected by the initial inertia weight and the maximum allowable velocity. To obtain the effective values of these parameters, several runs can be done. Using a uniform distribution, the random values r, and $r_2$ could be generated in the traditional PSO (see Dai, H.-P.; Chen, D.-D.; Zheng, Z.-S. Effects of Random Values for Particle Swarm Optimization Algorithm. Algorithms 2018, 11, 23—incorporated herein by reference in its entirety). In addition, to get the global optima effectively and quickly without falling into the local optima, large-scale random values should be selected in the PSO algorithms. However, a range of [−1, 1] is more beneficial to improve the global searching capability in a low dimensional practical optimization problem (see Dai, H.-P.; Chen, D.-D.; Zheng, Z.-S. Effects of Random Values for Particle Swarm Optimization Algorithm. Algorithms 2018, 11, 23—incorporated herein by reference in its entirety). For PSO algorithm with different types of random values, the impact of random values on the particle velocity was discoursed in details (see Dai, H.-P.; Chen, D.-D.; Zheng, Z.-S. Effects of Random Values for Particle Swarm Optimization Algorithm. Algorithms 2018, 11, 23—incorporated herein by reference in its entirety).

Actually, to achieve an efficient PSO performance, these parameters should be carefully selected (see Abido, M. Optimal design of power-system stabilizers using particle swarm optimization. IEEE Trans. Energy Convers. 2002, 17, 406-413—incorporated herein by reference in its entirety). In the present disclosure, the following PSO parameters are assumed: (1) Population size=20; (2) Decrement constant (a)=0.98; (3) Inertia weight factor=1; (4) Acceleration constants; $c_1=c_2=2$; (5) Generation or iteration=100.

Figure 7:
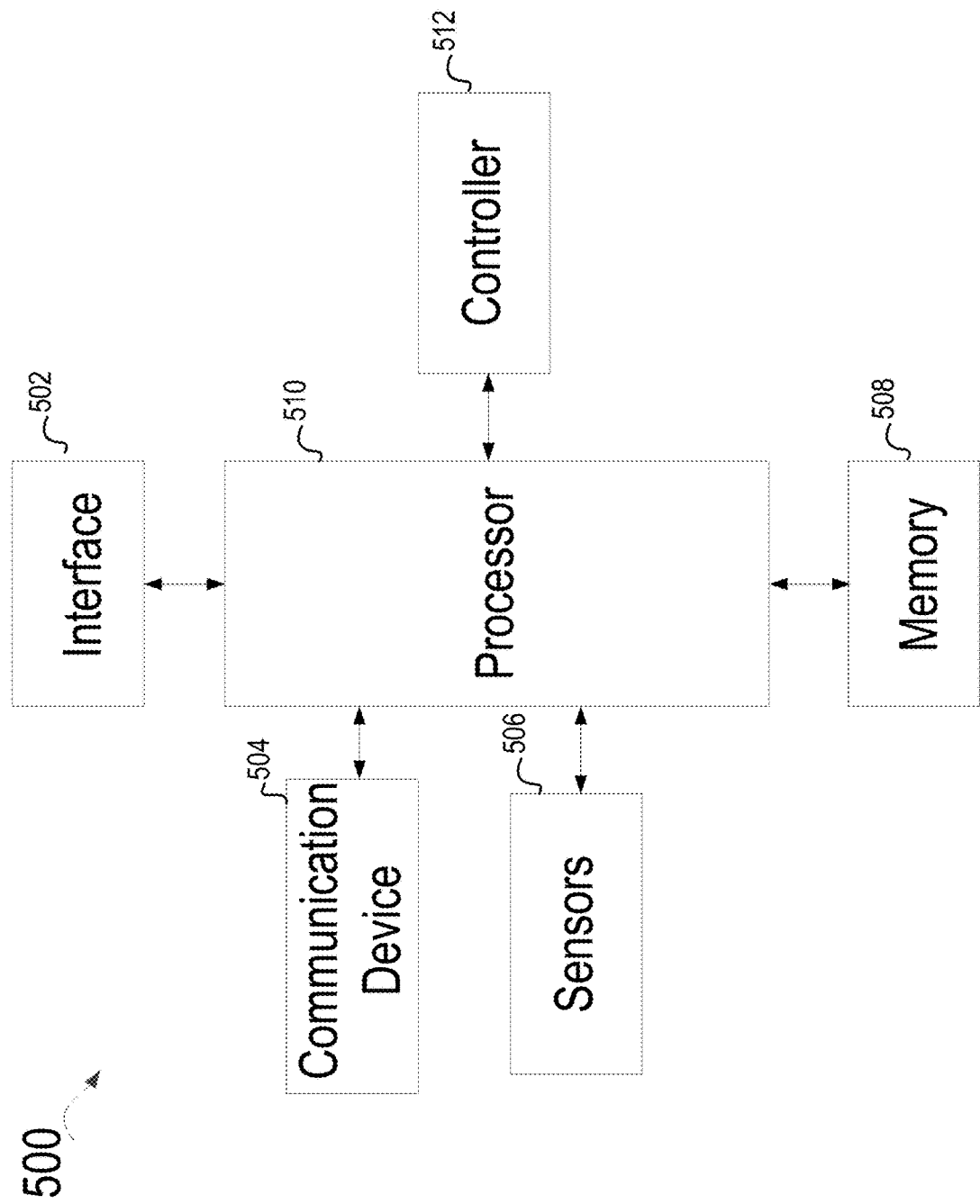
FIG. 7 is a schematic diagram of an apparatus for stabilizing an autonomous microgrid, in accordance with some embodiments.

FIG. 7 is an apparatus 500 that can perform the PSO mentioned above. As shown in FIG. 7, the apparatus 500 can have an interface 502 that is configured to receive inputs form an operator, a communication device 504 configured to display calculation results based on the PSO. The apparatus 500 can have a plurality of sensors 506. The sensors 506 can collect voltage signals and current signals from the microgrid 100. The apparatus 500 can also have a memory 508 configured to store signals sensed by the sensors 506. The apparatus 500 can have a processor 510 which is configured to receive the inputs from the operator via interface 512 and the signals from the sensors 506, and operate the PSO algorithm to determine the optimal controller parameters and optimal power-sharing coefficients of the microgrid 100. The apparatus 500 can further have a controller 512 that is configured to receive a determination made by the processor 510, and control the microgrid 100 accordingly.

Figure 8:
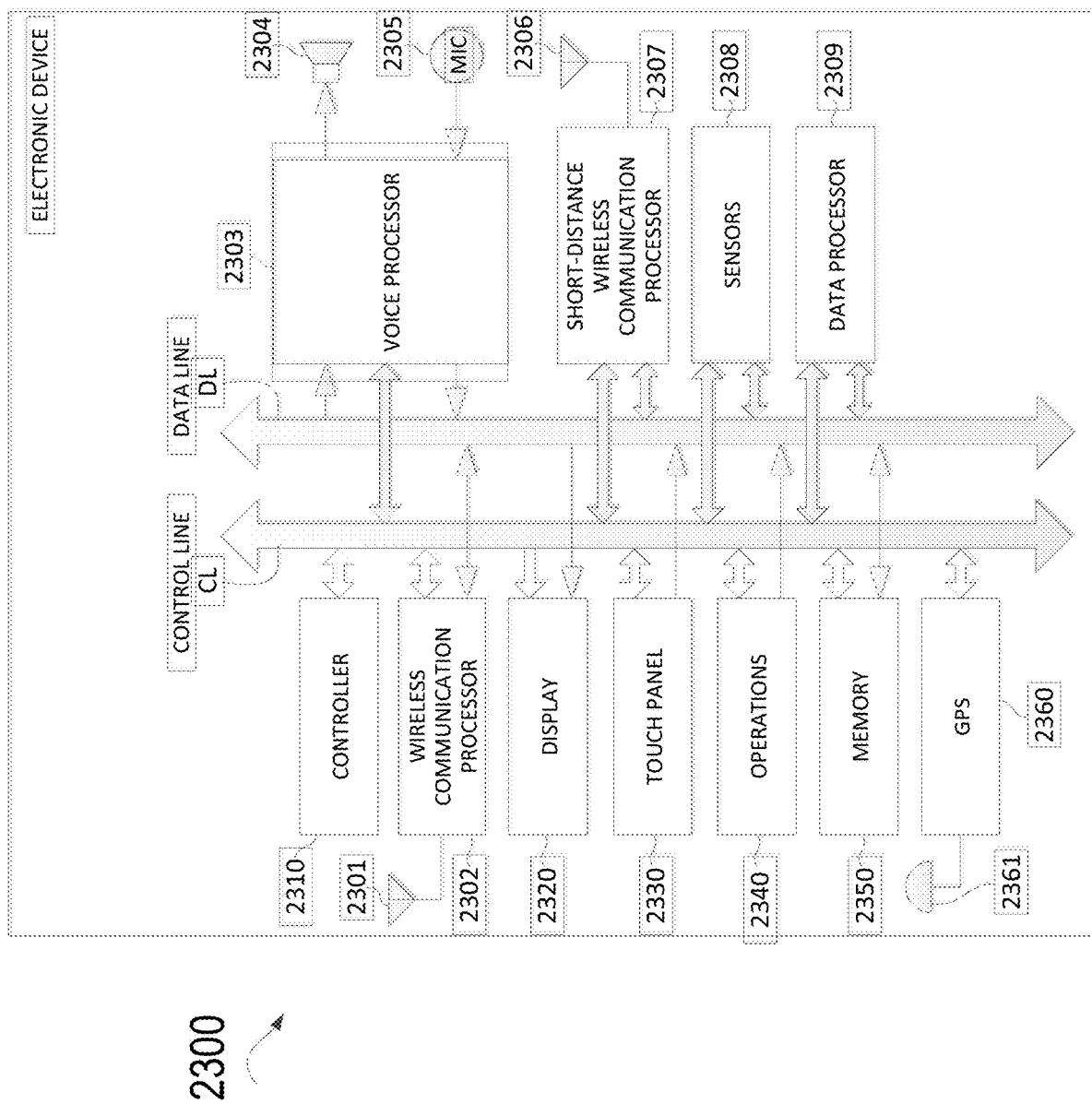
FIG. 8 is a block diagram illustrating an exemplary electronic device, in accordance with some embodiments.

FIG. 8 is a block diagram illustrating an exemplary electronic device used in accordance with embodiments of the present disclosure. In an embodiment, electronic device 2300 can be used as the apparatus illustrated in FIG. 5 to perform the PSO algorithm determine the improved controller parameters and improved power-sharing coefficients of the microgrid 100.

The exemplary electronic device 2300 of FIG. 8 includes a controller 2310 and a wireless communication processor 2302 connected to an antenna 2301. A speaker 2304 and a microphone 2305 are connected to a voice processor 2303. The controller 2310 can include one or more Central Processing Units (CPUs), and can control each element in the electronic device 2300 to perform functions related to communication control, audio signal processing, control for the audio signal processing, still and moving image processing and control, and other kinds of signal processing. The controller 2310 can perform these functions by executing instructions stored in a memory 2350. Alternatively or in addition to the local storage of the memory 2350, the functions can be executed using instructions stored on an external device accessed on a network or on a non-transitory computer readable medium.

The memory 2350 includes but is not limited to Read Only Memory (ROM), Random Access Memory (RAM), or a memory array including a combination of volatile and non-volatile memory units. The memory 2350 can be utilized as working memory by the controller 2310 while executing the processes and algorithms of the present disclosure. Additionally, the memory 2350 can be used for long-term storage, e.g., of image data and information related thereto.

The electronic device 2300 includes a control line CL and data line DL as internal communication bus lines. Control data to/from the controller 2310 can be transmitted through the control line CL. The data line DL can be used for transmission of voice data, display data, etc.

The antenna 2301 transmits/receives electromagnetic wave signals between base stations for performing radio-based communication, such as the various forms of cellular telephone communication. The wireless communication processor 2302 controls the communication performed between the electronic device 2300 and other external devices via the antenna 2301. For example, the wireless communication processor 2302 can control communication between base stations for cellular phone communication.

The speaker 2304 emits an audio signal corresponding to audio data supplied from the voice processor 2303. The microphone 2305 detects surrounding audio and converts the detected audio into an audio signal. The audio signal can then be output to the voice processor 2303 for further processing. The voice processor 2303 demodulates and/or decodes the audio data read from the memory 2350 or audio data received by the wireless communication processor 2302 and/or a short-distance wireless communication processor 2307. Additionally, the voice processor 2303 can decode audio signals obtained by the microphone 2305.

The exemplary electronic device 2300 can also include a display 2320, a touch panel 2330, an operations key 2340, and an antenna 2306 connected to the short-distance communication processor 2307. The display 2320 can be a Liquid Crystal Display (LCD), an organic electroluminescence display panel, or another display screen technology. In addition to displaying still and moving image data, the display 2320 can display operational inputs, such as numbers or icons which can be used for control of the electronic device 2300. The display 2320 can additionally display a GUI for a user to control aspects of the electronic device 2300 and/or other devices. Further, the display 2320 can display characters and images received by the electronic device 2300 and/or stored in the memory 2350 or accessed from an external device on a network. For example, the electronic device 2300 can access a network such as the Internet and display text and/or images transmitted from a Web server.

The touch panel 2330 can include a physical touch panel display screen and a touch panel driver. The touch panel 2330 can include one or more touch sensors for detecting an input operation on an operation surface of the touch panel display screen. The touch panel 2330 also detects a touch shape and a touch area. Used herein, the phrase "touch operation" refers to an input operation performed by touching an operation surface of the touch panel display with an instruction object, such as a finger, thumb, or stylus-type instrument. In the case where a stylus or the like is used in a touch operation, the stylus can include a conductive material at least at the tip of the stylus such that the sensors included in the touch panel 2330 can detect when the stylus approaches/contacts the operation surface of the touch panel display (similar to the case in which a finger is used for the touch operation).

According to aspects of the present disclosure, the touch panel 2330 can be disposed adjacent to the display 2320 (e.g., laminated) or can be formed integrally with the display 2320. For simplicity, the present disclosure assumes the touch panel 2330 is formed integrally with the display 2320 and therefore, examples discussed herein can describe touch operations being performed on the surface of the display 2320 rather than the touch panel 2330. However, the skilled artisan will appreciate that this is not limiting.

For simplicity, the present disclosure assumes the touch panel 2330 is a capacitance-type touch panel technology. However, it should be appreciated that aspects of the present disclosure can easily be applied to other touch panel types (e.g., resistance-type touch panels) with alternate structures. According to aspects of the present disclosure, the touch panel 2330 can include transparent electrode touch sensors arranged in the X-Y direction on the surface of transparent sensor glass.

The touch panel driver can be included in the touch panel 2330 for control processing related to the touch panel 2330, such as scanning control. For example, the touch panel driver can scan each sensor in an electrostatic capacitance transparent electrode pattern in the X-direction and Y-direction and detect the electrostatic capacitance value of each sensor to determine when a touch operation is performed. The touch panel driver can output a coordinate and corresponding electrostatic capacitance value for each sensor. The touch panel driver can also output a sensor identifier that can be mapped to a coordinate on the touch panel display screen. Additionally, the touch panel driver and touch panel sensors can detect when an instruction object, such as a finger is within a predetermined distance from an operation surface of the touch panel display screen. That is, the instruction object does not necessarily need to directly contact the operation surface of the touch panel display screen for touch sensors to detect the instruction object and perform processing described herein. Signals can be transmitted by the touch panel driver, e.g. in response to a detection of a touch operation, in response to a query from another element based on timed data exchange, etc.

The touch panel 2330 and the display 2320 can be surrounded by a protective casing, which can also enclose the other elements included in the electronic device 2300. According to aspects of the disclosure, a position of the user's fingers on the protective casing (but not directly on the surface of the display 2320) can be detected by the touch panel 2330 sensors. Accordingly, the controller 2310 can perform display control processing described herein based on the detected position of the user's fingers gripping the casing. For example, an element in an interface can be moved to a new location within the interface (e.g., closer to one or more of the fingers) based on the detected finger position.

Further, according to aspects of the disclosure, the controller 2310 can be configured to detect which hand is holding the electronic device 2300, based on the detected finger position. For example, the touch panel 2330 sensors can detect a plurality of fingers on the left side of the electronic device 2300 (e.g., on an edge of the display 2320 or on the protective casing), and detect a single finger on the right side of the electronic device 2300. In this exemplary scenario, the controller 2310 can determine that the user is holding the electronic device 2300 with his/her right hand because the detected grip pattern corresponds to an expected pattern when the electronic device 2300 is held only with the right hand.

The operation key 2340 can include one or more buttons or similar external control elements, which can generate an operation signal based on a detected input by the user. In addition to outputs from the touch panel 2330, these operation signals can be supplied to the controller 2310 for performing related processing and control. According to aspects of the disclosure, the processing and/or functions associated with external buttons and the like can be performed by the controller 2310 in response to an input operation on the touch panel 2330 display screen rather than the external button, key, etc. In this way, external buttons on the electronic device 2300 can be eliminated in lieu of performing inputs via touch operations, thereby improving water-tightness.

The antenna 2306 can transmit/receive electromagnetic wave signals to/from other external apparatuses, and the short-distance wireless communication processor 2307 can control the wireless communication performed between the other external apparatuses. Bluetooth, IEEE 802.11, and near-field communication (NFC) are non-limiting examples of wireless communication protocols that can be used for inter-device communication via the short-distance wireless communication processor 2307.

The electronic device 2300 can include sensors 2308. The motion sensors 2308 can sense the voltage signals and current signals of the microgrid 100.

Electronic device 2300 can include a data processor 2309, which is configured to receive the inputs from the operator via the touch panel 2330 and the signals from the sensors 2308, and operate a method, such as the method mentioned above to optimize the microgrid 100.

Figure 9:
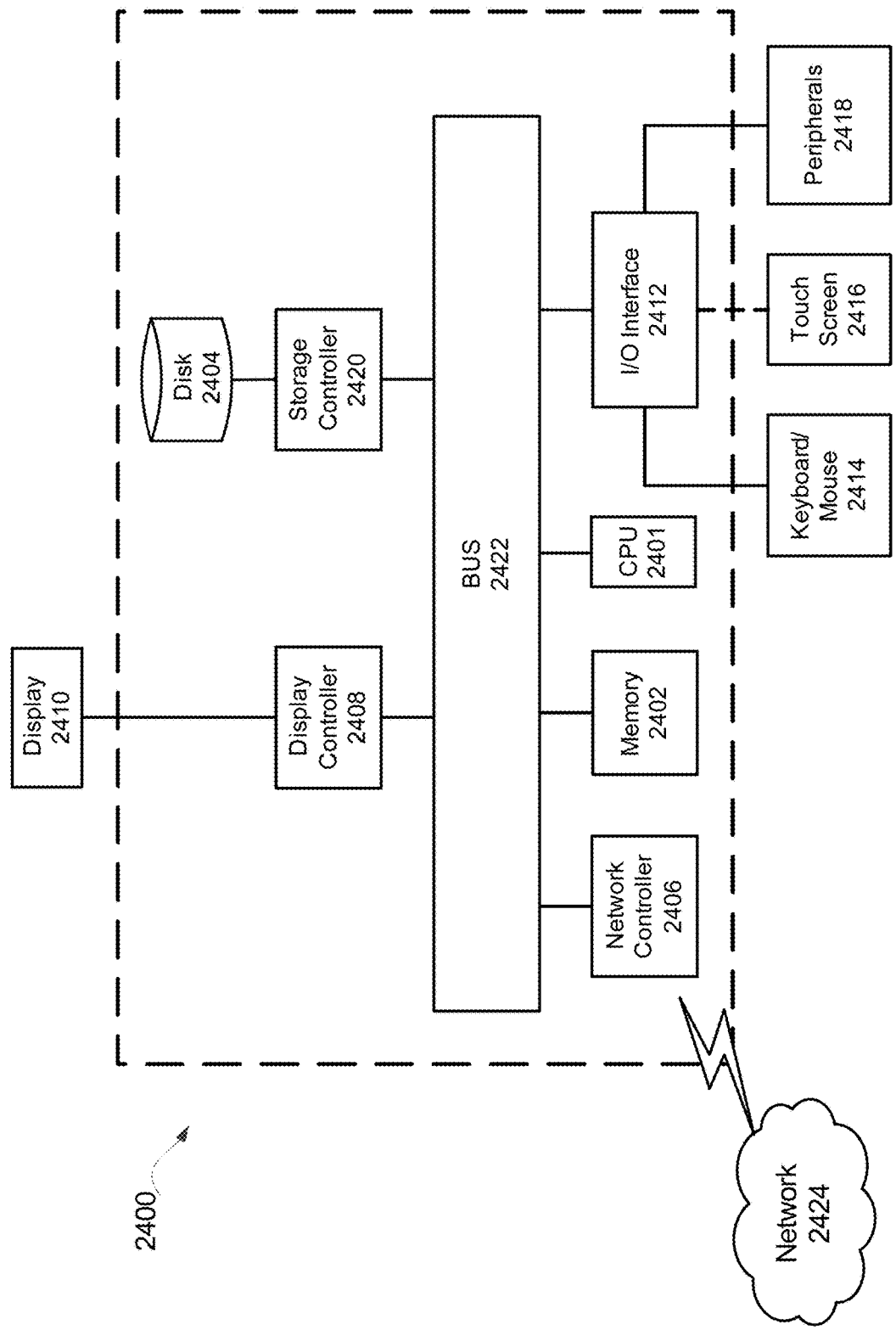
FIG. 9 is a block diagram of a hardware description of a processor, in accordance with some embodiments.

FIG. 9 is a block diagram of a hardware description of a computer 2400 used in exemplary embodiments. In the embodiments, computer 2400 can be a desk top, laptop, or server. The computer 2400 could be used as the processor 510 illustrated in FIG. 7.

As shown in FIG. 9, the computer 2400 includes a CPU 2401 which performs the processes described herein. The process data and instructions may be stored in memory 2402. These processes and instructions may also be stored on a storage medium disk 2404 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computer 2400 communicates, such as a server or computer.

Further, the claimed advancements may be provided as a utility application, background daemon, or component of an operating system, or combination thereof, executing in conjunction with CPU 2401 and an operating system such as Microsoft® Windows®, UNIX®, Oracle® Solaris, LINUX®, Apple macOS® and other systems known to those skilled in the art.

In order to achieve the computer 2400, the hardware elements may be realized by various circuitry elements, known to those skilled in the art. For example, CPU 2401 may be a Xenon® or Core® processor from Intel Corporation of America or an Opteron® processor from AMD of America, or may be other processor types that would be recognized by one of ordinary skill in the art. Alternatively, the CPU 2401 may be implemented on an FPGA, ASIC, PLD or using discrete logic circuits, as one of ordinary skill in the art would recognize. Further, CPU 2401 may be implemented as multiple processors cooperatively working in parallel to perform the instructions of the inventive processes described above.

The computer 2400 in FIG. 9 also includes a network controller 2406, such as an Intel Ethernet PRO network interface card from Intel Corporation of America, for interfacing with network 2424. As can be appreciated, the network 2424 can be a public network, such as the Internet, or a private network such as LAN or WAN network, or any combination thereof and can also include PSTN or ISDN sub-networks. The network 2424 can also be wired, such as an Ethernet network, or can be wireless such as a cellular network including EDGE, 3G and 4G wireless cellular systems. The wireless network can also be WiFi®, Bluetooth®, or any other wireless form of communication that is known.

The computer 2400 further includes a display controller 2408, such as a NVIDIA® GeForce® GTX or Quadro® graphics adaptor from NVIDIA Corporation of America for interfacing with display 2410, such as a Hewlett Packard® HPL2445w LCD monitor. A general purpose I/O interface 2412 interfaces with a keyboard and/or mouse 2414 as well as an optional touch screen panel 2416 on or separate from display 2410. General purpose I/O interface 2412 also connects to a variety of peripherals 2418 including printers and scanners, such as an OfficeJet® or DeskJet® from Hewlett Packard.

The general purpose storage controller 2420 connects the storage medium disk 2404 with communication bus 2422, which may be an ISA, EISA, VESA, PCI, or similar, for interconnecting all of the components of the computer 2400. A description of the general features and functionality of the display 2410, keyboard and/or mouse 2414, as well as the display controller 2408, storage controller 2420, network controller 2406, and general purpose I/O interface 2412 is omitted herein for brevity as these features are known.

Figure 10:
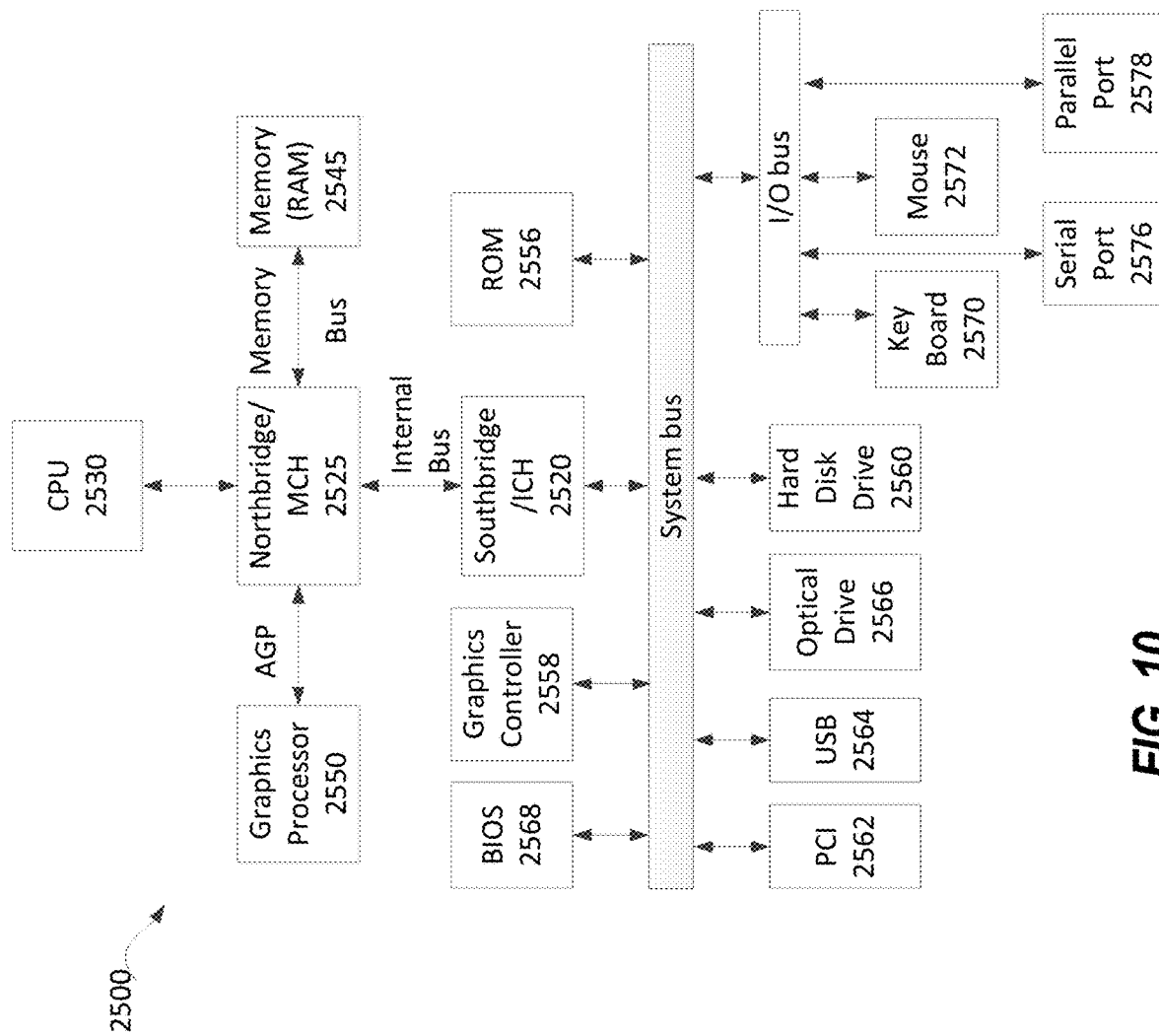
FIG. 10 is a schematic diagram of an exemplary data processing system, in accordance with some embodiments.

FIG. 10 is a schematic diagram of an exemplary data processing system 2500. The data processing system is an example of a computer or a processor in which code or instructions implementing the processes of the illustrative embodiments can be located. The data processing system 2500 can be applied to operate the PSO algorithms to obtain the optimal controller parameters and optimal power-sharing coefficients of the microgrid 100.

In FIG. 10, data processing system 2500 employs an application architecture including a north bridge and memory controller hub (NB/MCH) 2525 and a south bridge and input/output (I/O) controller hub (SB/ICH) 2520. The central processing unit (CPU) 2530 is connected to NB/MCH 2525. The NB/MCH 2525 also connects to the memory 2545 via a memory bus, and connects to the graphics processor 2550 via an accelerated graphics port (AGP). The NB/MCH 2525 also connects to the SB/ICH 2520 via an internal bus (e.g., a unified media interface or a direct media interface). The CPU 2530 can contain one or more processors and even can be implemented using one or more heterogeneous processor systems.

Figure 11:
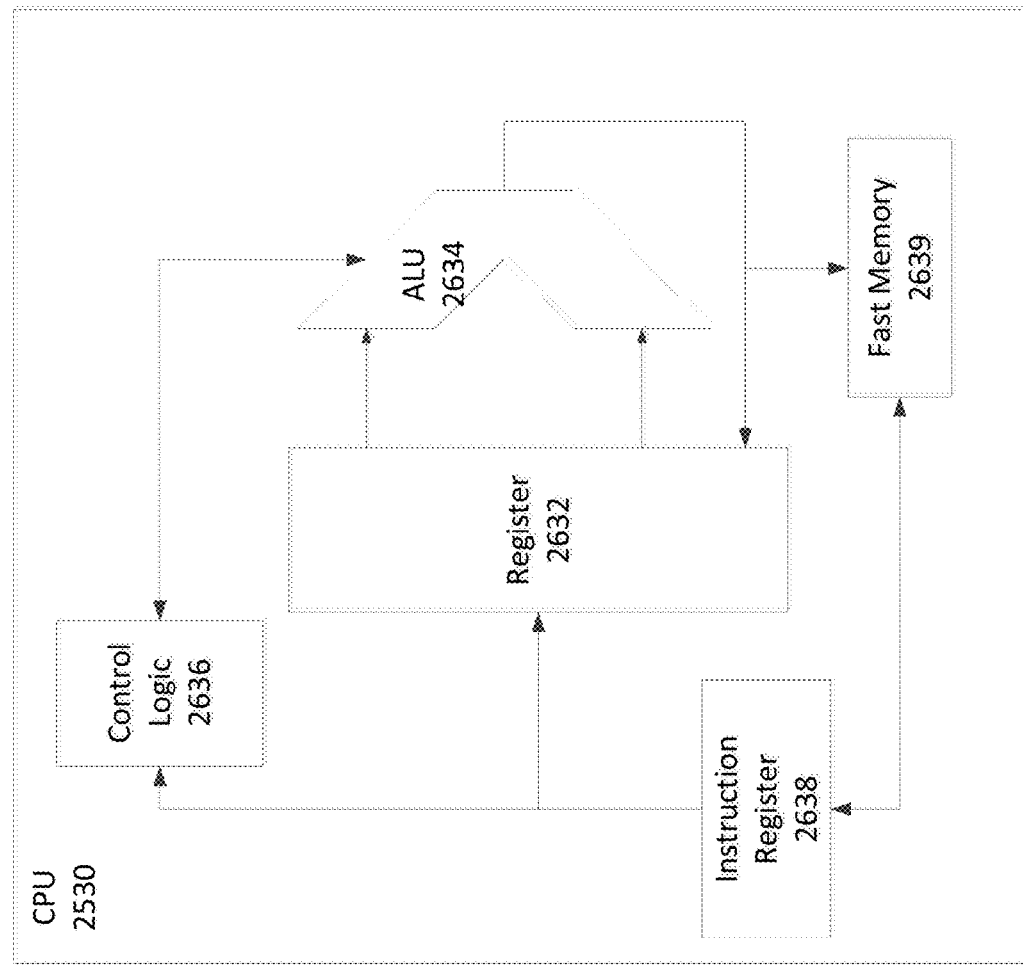
FIG. 11 illustrates an implementation of a CPU, in accordance with some embodiments.

FIG. 11 illustrates an implementation of CPU 2530. In one implementation, an instruction register 2638 retrieves instructions from a fast memory 2639. At least part of these instructions are fetched from an instruction register 2638 by a control logic 2636 and interpreted according to the instruction set architecture of the CPU 2530. Part of the instructions can also be directed to a register 2632. In one implementation the instructions are decoded according to a hardwired method, and in another implementation the instructions are decoded according to a microprogram that translates instructions into sets of CPU configuration signals that are applied sequentially over multiple clock pulses. After fetching and decoding the instructions, the instructions are executed using an arithmetic logic unit (ALU) 2634 that loads values from the register 2632 and performs logical and mathematical operations on the loaded values according to the instructions. The results from these operations can be fed back into the register 2632 and/or stored in a fast memory 2639. According to aspects of the present disclosure, the instruction set architecture of the CPU 2530 can use a reduced instruction set computer (RISC), a complex instruction set computer (CISC), a vector processor architecture, or a very long instruction word (VLIW) architecture. Furthermore, the CPU 2530 can be based on the Von Neuman model or the Harvard model. The CPU 2530 can be a digital signal processor, an FPGA, an ASIC, a PLA, a PLD, or a CPLD. Further, the CPU 2530 can be an x86 processor by Intel or by AMD; an ARM processor; a Power architecture processor by, e.g., IBM; a SPARC architecture processor by Sun Microsystems or by Oracle; or other known CPU architectures.

Referring again to FIG. 10, the data processing system 2500 can include the SB/ICH 2520 being coupled through a system bus to an I/O Bus, a read only memory (ROM) 2556, universal serial bus (USB) port 2564, a flash binary input/output system (BIOS) 2568, and a graphics controller 2558. PCI/PCIe devices can also be coupled to SB/ICH 2520 through a PCI bus 2562.

The PCI devices can include, for example, Ethernet adapters, add-in cards, and PC cards for notebook computers. The Hard disk drive 2560 and CD-ROM 2566 can use, for example, an integrated drive electronics (IDE) or serial advanced technology attachment (SATA) interface. In one implementation the I/O bus can include a super I/O (SIO) device.

Further, the hard disk drive (HDD) 2560 and optical drive 2566 can also be coupled to the SB/ICH 2520 through a system bus. In one implementation, a keyboard 2570, a mouse 2572, a parallel port 2578, and a serial port 2576 can be connected to the system bus through the I/O bus. Other peripherals and devices can be connected to the SB/ICH 2520 using a mass storage controller such as SATA or PATA, an Ethernet port, an ISA bus, a LPC bridge, SMBus, a DMA controller, and an Audio Codec.

Figure 12:
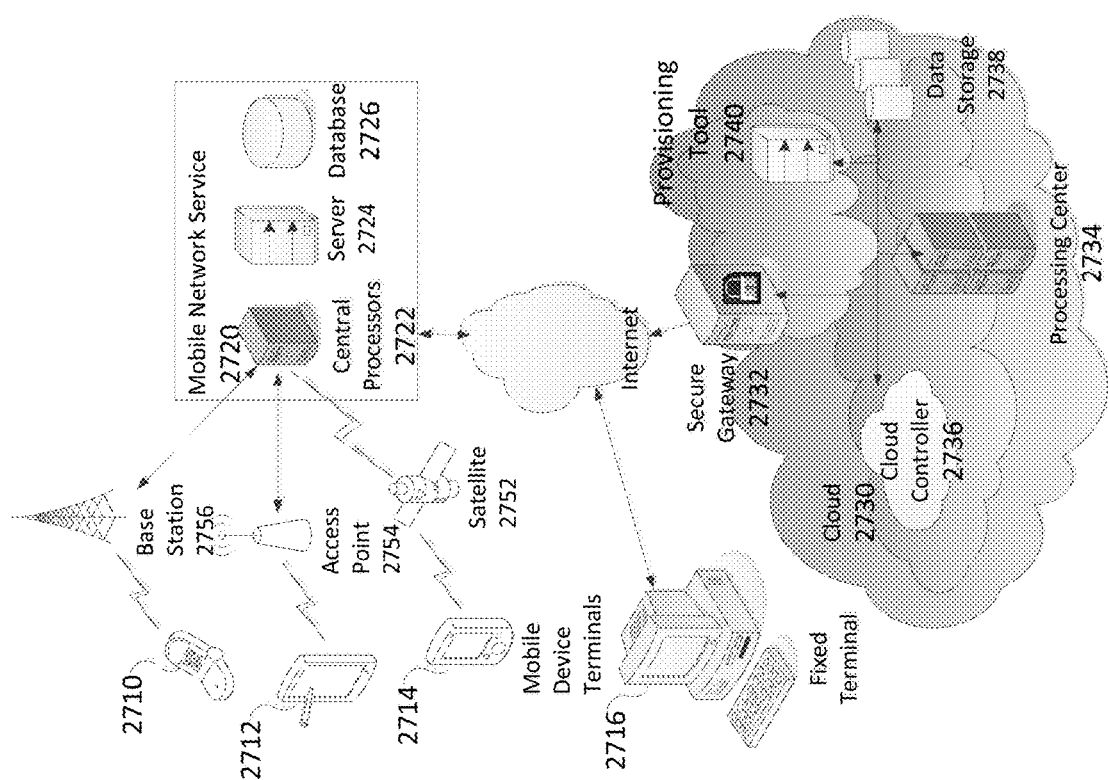
FIG. 12 illustrates an exemplary cloud computing system, in accordance with some embodiments.

FIG. 12 illustrates an exemplary cloud computing system, where users access the cloud through mobile device terminals or fixed terminals that are connected to the Internet. The apparatus illustrated in FIG. 7 could be one of the mobile device terminals or one of the fixed terminals that are used in the cloud computing system illustrated in FIG. 12.

The mobile device terminals can include a cell phone 2710, a tablet computer 2712, and a smartphone 2714, for example. The mobile device terminals can connect to a mobile network service 2720 through a wireless channel such as a base station 2756 (e.g., an Edge, 3G, 4G, or LTE Network), an access point 2754 (e.g., a femto cell or WiFi network), or a satellite connection 2752. In one implementation, signals from the wireless interface to the mobile device terminals (e.g., the base station 2756, the access point 2754, and the satellite connection 2752) are transmitted to a mobile network service 2720, such as an EnodeB and radio network controller, UMTS, or HSDPA/HSUPA. Mobile users' requests and information are transmitted to central processors 2722 that are connected to servers 2724 to provide mobile network services, for example. Further, mobile network operators can provide service to mobile users for authentication, authorization, and accounting based on home agent and subscribers' data stored in databases 2726, for example. The subscribers' requests are subsequently delivered to a cloud 2730 through the Internet.

A user can also access the cloud through a fixed terminal 2716, such as a desktop or laptop computer or workstation that is connected to the Internet via a wired network connection or a wireless network connection. The mobile network service 2720 can be a public or a private network such as an LAN or WAN network. The mobile network service 2720 can be wireless such as a cellular network including EDGE, 3G and 4G wireless cellular systems. The wireless mobile network service 2720 can also be Wi-Fi, Bluetooth, or any other wireless form of communication that is known.

The user's terminal, such as a mobile user terminal and a fixed user terminal, provides a mechanism to connect via the Internet to the cloud 2730 and to receive output from the cloud 2730, which is communicated and displayed at the user's terminal. In the cloud 2730, a cloud controller 2736 processes the request to provide users with the corresponding cloud services. These services are provided using the concepts of utility computing, virtualization, and service-oriented architecture.

In one implementation, the cloud 2730 is accessed via a user interface such as a secure gateway 2732. The secure gateway 2732 can for example, provide security policy enforcement points placed between cloud service consumers and cloud service providers to interject enterprise security policies as the cloud-based resources are accessed. Further, the secure gateway 2732 can consolidate multiple types of security policy enforcement, including for example, authentication, single sign-on, authorization, security token mapping, encryption, tokenization, logging, alerting, and API control. The cloud 2730 can provide to users, computational resources using a system of virtualization, wherein processing and memory requirements can be dynamically allocated and dispersed among a combination of processors and memories to create a virtual machine that is more efficient at utilizing available resources. Virtualization creates an appearance of using a single seamless computer, even though multiple computational resources and memories can be utilized according to increases or decreases in demand. In one implementation, virtualization is achieved using a provisioning tool 2740 that prepares and equips the cloud resources, such as the processing center 2734 and data storage 2738 to provide services to the users of the cloud 2730. The processing center 2734 can be a computer cluster, a data center, a main frame computer, or a server farm. In one implementation, the processing center 2734 and data storage 2738 are collocated.

Embodiments described herein can be implemented in conjunction with one or more of the devices described above with reference to FIGS. 7-12. Embodiments can include a combination of hardware and software, and circuitry by which the software is implemented.

To assess the effectiveness of the method and system for control of the microgrid, the microgrid was modeled in MATLAB. In both ac and dc sides and different disturbances were applied to investigate the optimal control effectiveness on the microgrid stability. Comparison between the controller of the present disclosure and related examples were investigated to prove the superiority of the disclosed method. Finally, the microgrid was established and implemented in a real time digital simulator (RTDS). The experimental results validated the simulation results and proved the effectiveness of the disclosed controllers to improve the microgrid stability.

The autonomous microgrid 100 shown in FIG. 1 can be modeled based on the PSO with the PSO parameters mentioned above through the one or more devices described above with reference to FIGS. 7-12. In the autonomous microgrid 100, three inverter-based DGs (10 kVA) are connected with CIL (5.8 kW) and CPL (7.3 kW) through coupling inductances, filters, and two transmission lines. Assuming an ideal source from the DG side, the dc bus dynamics can be neglected. With the realization of high switching frequencies (4-10 kHz), the switching process of the inverter may also be neglected (see Hornik, T.; Zhong, Q. A Current-Control Strategy for Voltage-Source Inverters in Microgrids Based on H∞ and Repetitive Control. IEEE Trans. Power Electron. 2011, 26, 943-952—incorporated herein by reference in its entirety). System parameters of the autonomous microgrid 100 can be summarized in Table 1.

TABLE 1

System parameters.

| Microgrid Parameters | | | | Active Load Parameters | | | |
|---|---|---|---|---|---|---|---|
| Parameter | Value | Parameter | Value | Parameter | Value | Parameter | Value |
| $f_s$ | 8 kHz | $V_n$ | 381 V | $L_f$ | 2.3 mH | $L_c$ | 0.93 mH |
| $L_f$ | 1.35 mH | $L_c$ | 0.35 mH | $C_f$ | $8.8 \times 10^{-6}$ F | $r_c$ | 0.03 Ω |
| $C_f$ | $50 \times 10^{-6}$ F | $C_b$ | $50 \times 10^{-6}$ F | $r_f$ | 0.1 Ω | | |
| $r_f$ | 0.1 Ω | $r_c$ | 0.03 Ω | $R_{dc}$ | 67.123 Ω | $C_{dc}$ | $2040 \times 10^{-6}$ F |
| $\omega_n$ | 314.16 rad/s | $\omega_c$ | 31.416 rad/s | | | | |
| $r_1 + jx_1$ | $(0.23 + j0.1)$ Ω | $r_2 + jx_2$ | $(0.25 + j0.58)$ Ω | | | | |

Based on time-domain simulation, the error in the measured active power and DC voltage can be curtailed by using the weighted objective function that is mentioned above. The parameters of the proposed active load and inverter controllers, PLL gains and power-sharing coefficients are presented in Table 2.

TABLE 2

Optimal parameters.

| PI Controller Parameters | | | | Power-Sharing Parameters of the Three DG Units | | | |
|---|---|---|---|---|---|---|---|
| Parameter | Value | Parameter | Value | Parameter | Value | Parameter | Value |
| $k_{pv(Amp/Watt)}$ | 17.268074 | $k_{pc(Amp/Watt)}$ | 3.0547 | $m_p$ | $3.79404 \times 10^{-7}$ | $n_q$ | $9.36593 \times 10^{-5}$ |
| | 20.7258764 | | 3.2025 | | $6.75934 \times 10^{-7}$ | | $1.86121 \times 10^{-5}$ |
| | 23.6522868 | | 2.8331 | | $1.71857 \times 10^{-7}$ | | $3.21349 \times 10^{-5}$ |
| $k_{(Amp/Joule)}$ | 64.356192 | $k_{ic(Amp/Joule)}$ | 2.4811 | Active Load Parameters | | | |
| | 89.1177596 | | 1.86315 | $k_{pv\_AL(Amp/Watt)}$ | 4.79107648 | $k_{pc\_AL(Amp/Watt)}$ | 2.3042 |
| | -10.0262696 | | 0.9311 | $k_{iv\_AL(Amp/Joules)}$ | 62.5416616 | $k_{ic\_AL(Amp/Joules)}$ | -0.3198 |
| PLL Parameters | | | | | | | |
| $kp^{PLL}$ | 50 | $k_I^{PLL}$ | 1 | | | | |

Figure 13A:
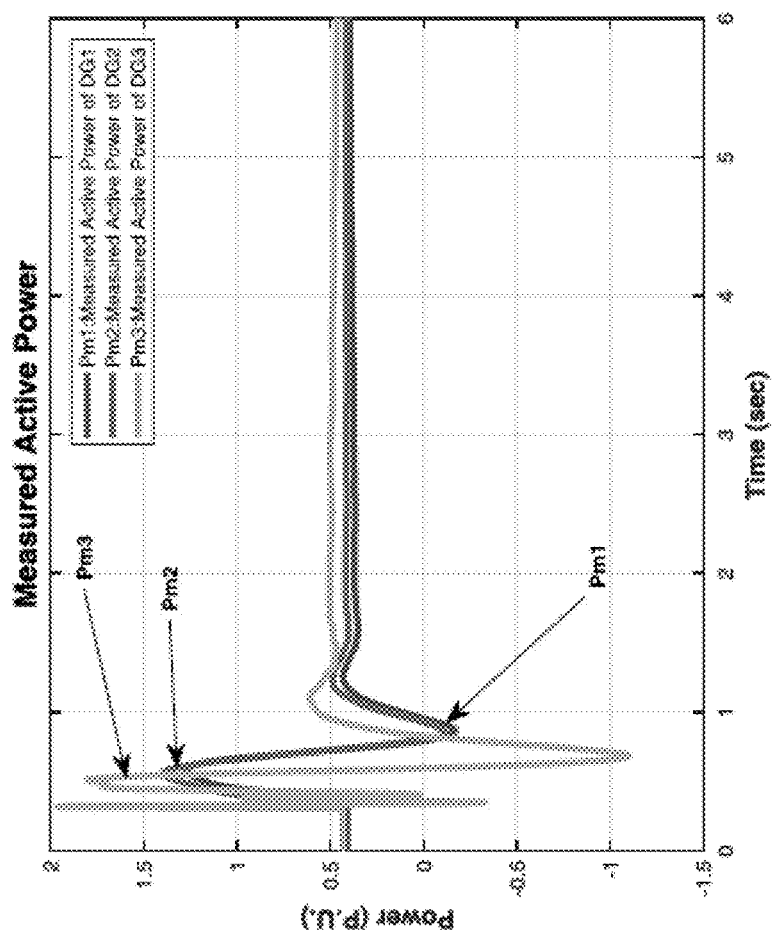
FIG. 13A illustrates a power response of a microgrid when a three-phase fault occurred at constant power load (CPL) bus, in accordance with some embodiments.
Figure 13B:
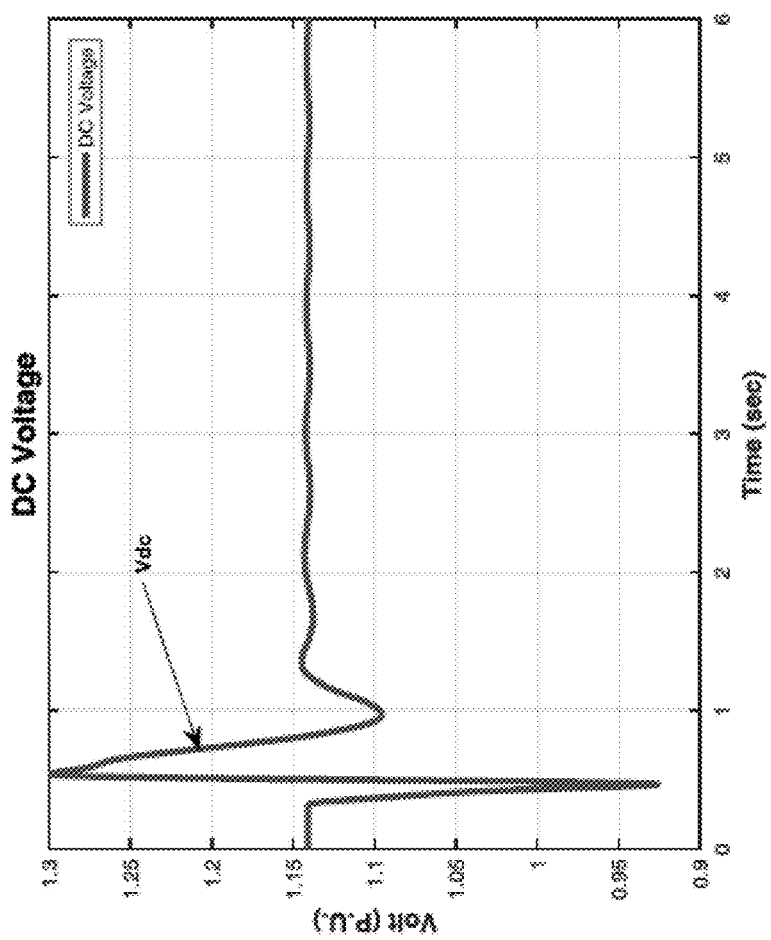
FIG. 13B illustrates a voltage response of a microgrid when a three-phase fault occurred at CPL bus, in accordance with some embodiments.

Fault and step change disturbances can be applied on both ac and dc sides to explore and assess the effect of the parameters on the microgrid stability. Through the time domain simulations, the microgrid performance can be examined firstly when three-phase fault occurred at active load bus. FIGS. 13A and 13B show the satisfactory damping characteristics of the proposed microgrid under the fault disturbance at active load bus.

FIGS. 13A and 13B depict the responses of the active power of the three DGs respectively and the DC output voltage of the DC side of the active load. To feed this fault, the output powers of the three DGs have been increased sharply after the fault immediately.

Additionally, the output power of DG3 is much greater than the output powers of the DG1 & DG2 because the fault occurred at active load bus which is closed to DG3. Secondly, the microgrid performance can be examined when a three phase fault is applied at line 2 at t=0.3 s then fault is cleared at t=0.6 s. During this period, DG1 and DG2 respond to support the passive load by its demand while DG3 is isolated to feed the active load by its powers.

Figure 14A:
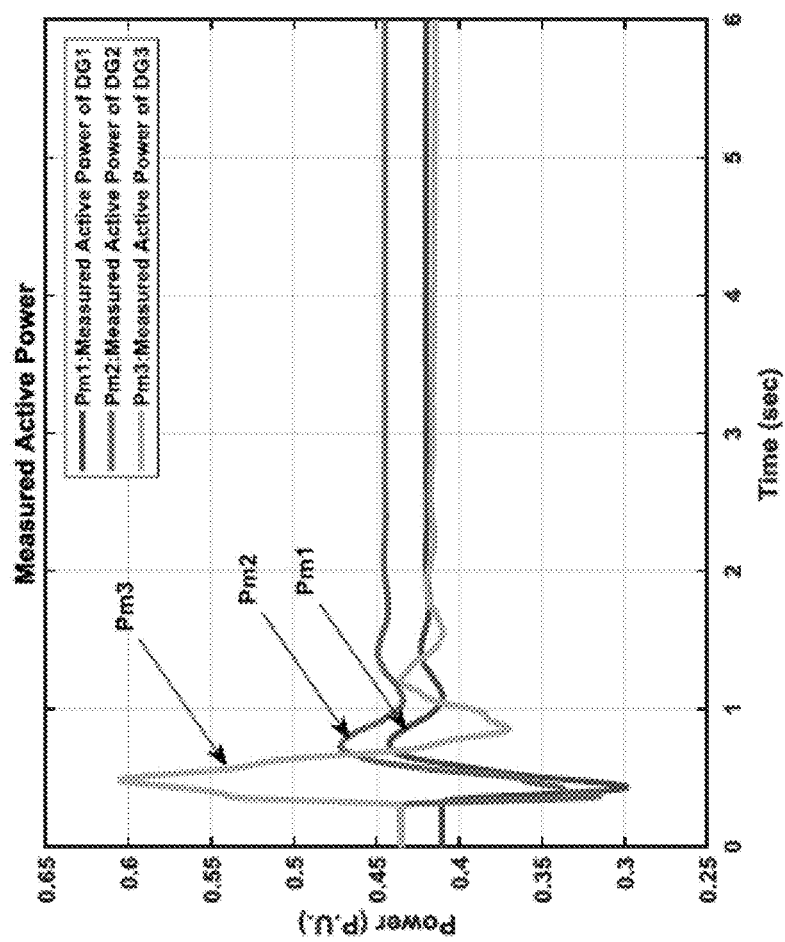
FIG. 14A illustrates a power response of a microgrid when a three-phase fault occurred at line 2, in accordance with some embodiments.
Figure 14B:
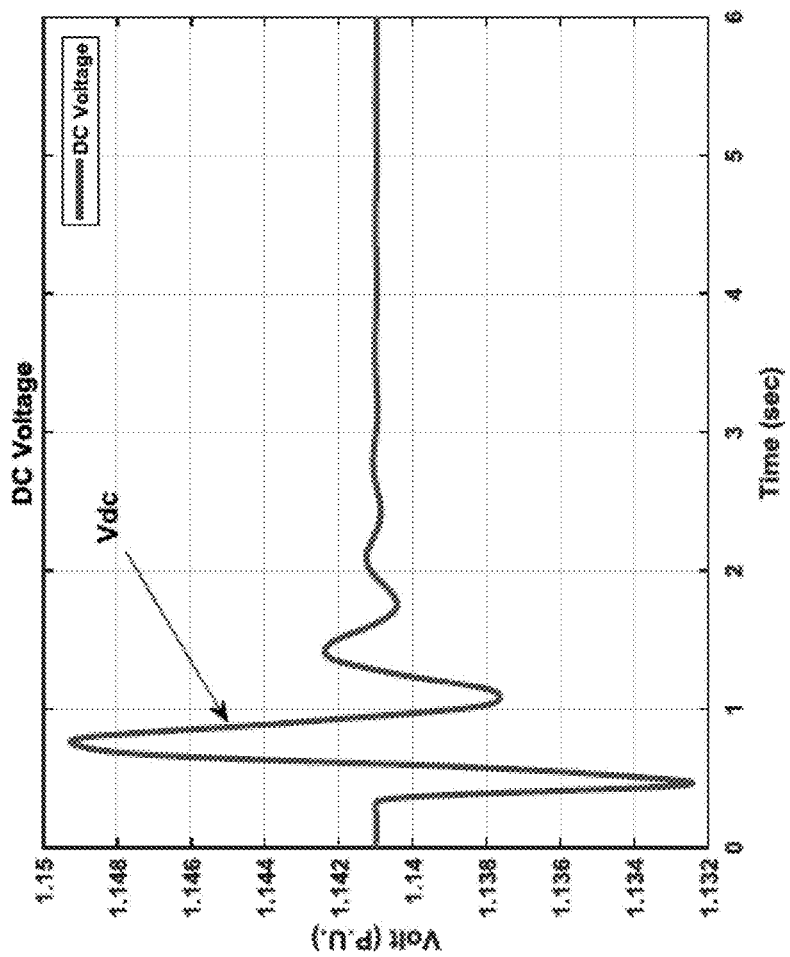
FIG. 14B illustrates a voltage response of a microgrid when a three-phase fault occurred at line 2, in accordance with some embodiments.

FIGS. 14A and 14B show the adequate damping characteristics of the presently disclosed controller. The DGs output powers response is illustrated in FIG. 14A, while FIG. 14B depicts the DC voltage response of the active load for this disturbance. It can be observed from the given results that the system performance has a good overshoot and settling time performance. Moreover, the results depict impressively enhanced damping characteristics. Thirdly, the controller capability is investigated and the microgrid performance is examined when the microgrid loses DG1. It means that both loads have to receive their powers from DG2 and DG3.

Figure 15A:
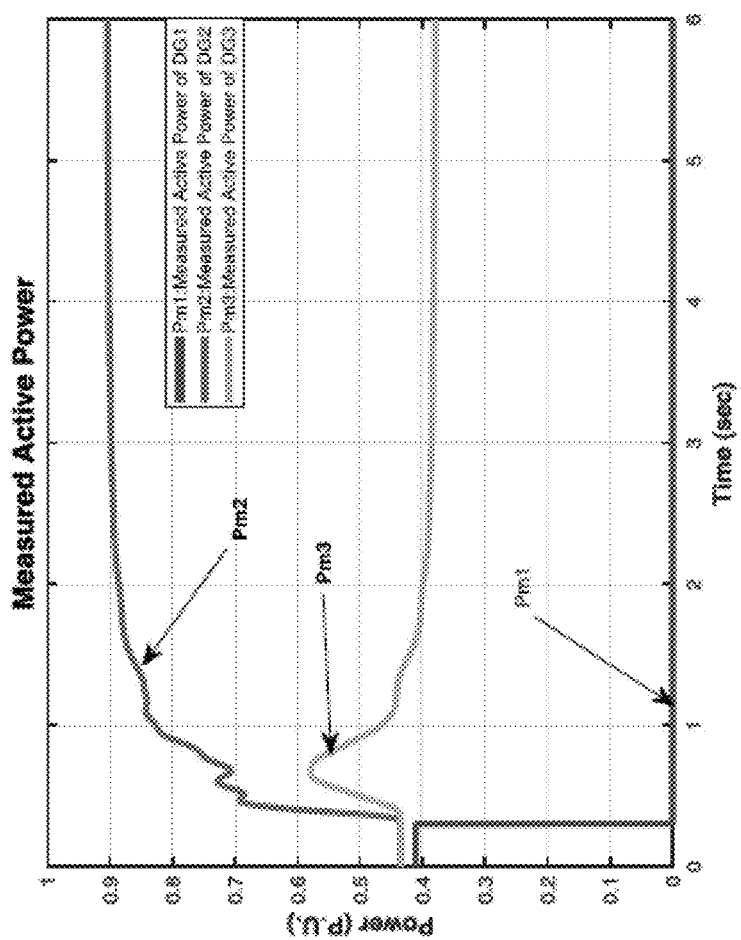
FIG. 15A illustrates a power response of a microgrid when the microgrid loses DG1, in accordance with some embodiments.
Figure 15B:
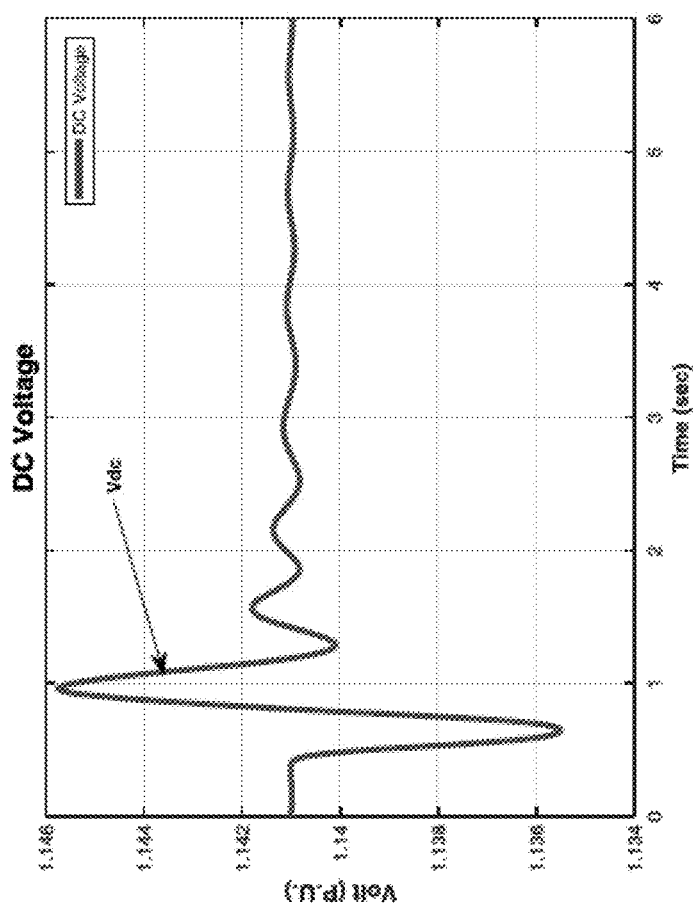
FIG. 15B illustrates a voltage response of a microgrid when the microgrid loses DG1, in accordance with some embodiments.

FIGS. 15A and 15B illustrate the response of the output real power of the three DGs and the DC voltage response of the active load. Additionally, DG1 and DG2 are capable of feeding both loads after the microgrid is disturbed. After losing DG1, the results show reasonable damping characteristics of the presently disclosed controller. From FIG. 9a, at the steady state operation, the output active powers of the three DGs are 0.41, 0.43, and 0.43 p.u. respectively. Therefore, the total output power is equal to 1.27 p.u. While after the microgrid is cleared from the fault disturbance, the output active powers of the three DGs are 0.0, 0.37, and 0.9 p.u. respectively. Therefore, the total output power is equal to 1.27 p.u. This means that the total output powers of all DGs before and after fault are equal. Therefore, the two DGs (DG2 and DG3) can share the same power that the three DGs (DG1, DG2, and DG3) have shared before the microgrid lost DG1. In addition, as it was mentioned above, each DG inverter is assumed to be connected to a constant dc power source, so there no need to regulate the dc-link voltage otherwise, a controller should be introduced to regulate the dc-link voltage (see Hornik, T.; Zhong, Q. A Current-Control Strategy for Voltage-Source Inverters in Microgrids Based on H∞ and Repetitive Control. IEEE Trans. Power Electron. 2011, 26, 943-952). Otherwise, DG3 output power could not be reached to this value since each DG source has a limited output power. For example, if DG3 represents a photovoltaic plant, the output power increase could not be available for many different reasons such as temperature and dc voltage regulations.

Figure 16A:
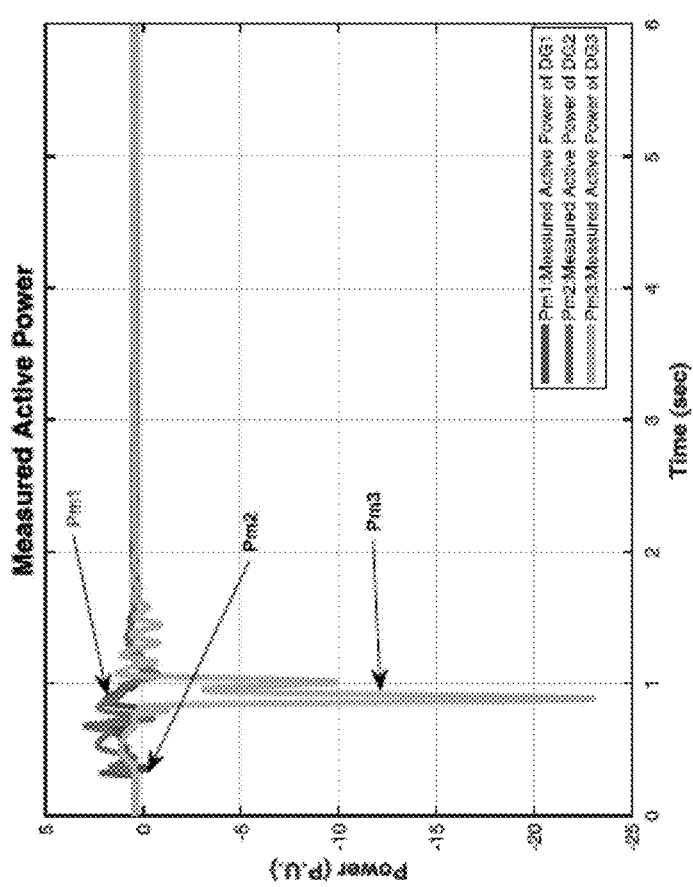
FIG. 16A illustrates a power response of a microgrid when an active load voltage stepped down to 0.5 pu, in accordance with some embodiments.
Figure 16B:
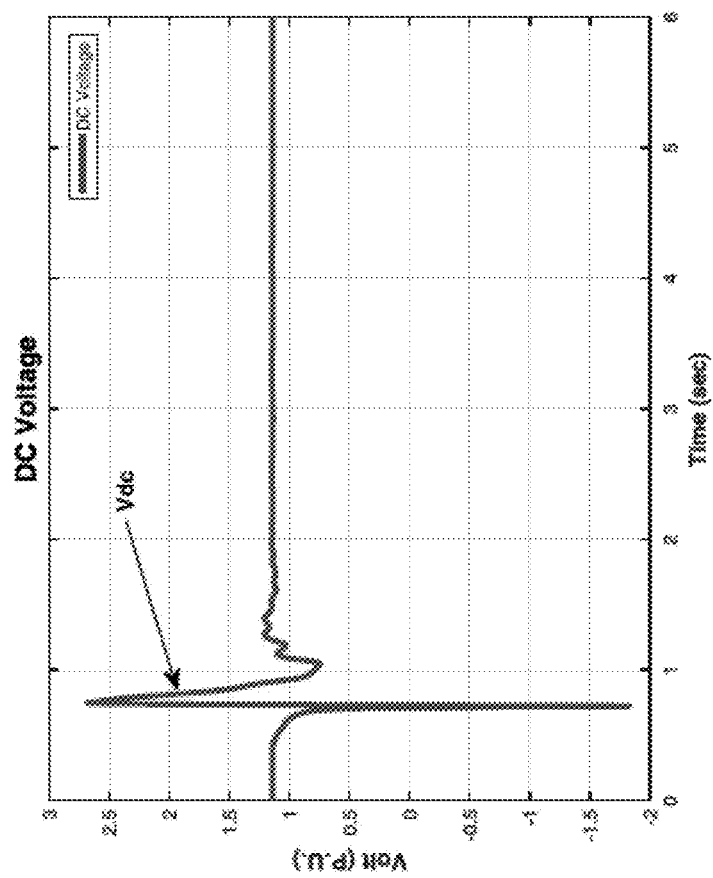
FIG. 16B illustrates a voltage response of a microgrid when an active load voltage stepped down to 0.5 pu, in accordance with some embodiments.
Figure 18:
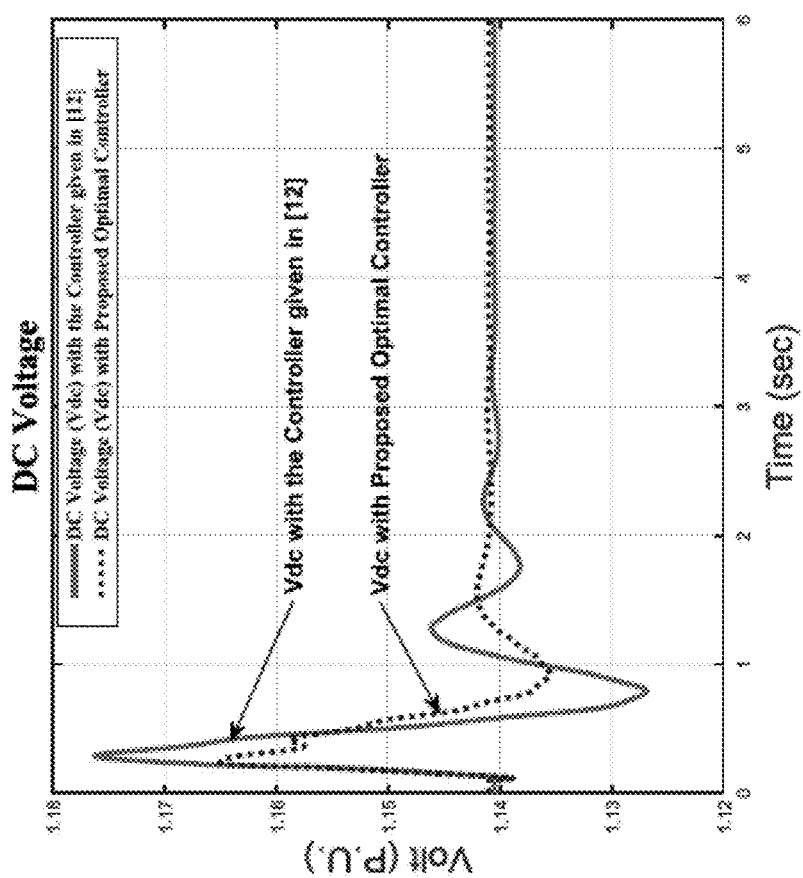
FIG. 18 illustrates a comparison of DC voltage responses of the active load when a fault occurred at CPL bus.

Fourthly, the microgrid performance has been examined when the CPL voltage stepped down to 0.5 p.u. The DGs output power and active load DC voltage responses are provided in FIGS. 16A and 16B. It can be observed from the given results that the system performance has a good overshoot and settling time performance. Furthermore, the results depict impressively enhanced damping characteristics. FIGS. 16A and 18B show reasonable damping characteristics of the presently disclosed controller. It is worth mentioning that if the microgrid has a protection system, the protection system should respond very quickly for such a big disturbance. Fifthly, to guarantee the controller capability, another disturbance has been applied at dc side of the active load. Through the time domain simulation, the presently disclosed controller has been explored when the DC reference voltage stepped up by 5%.

Figure 17A:
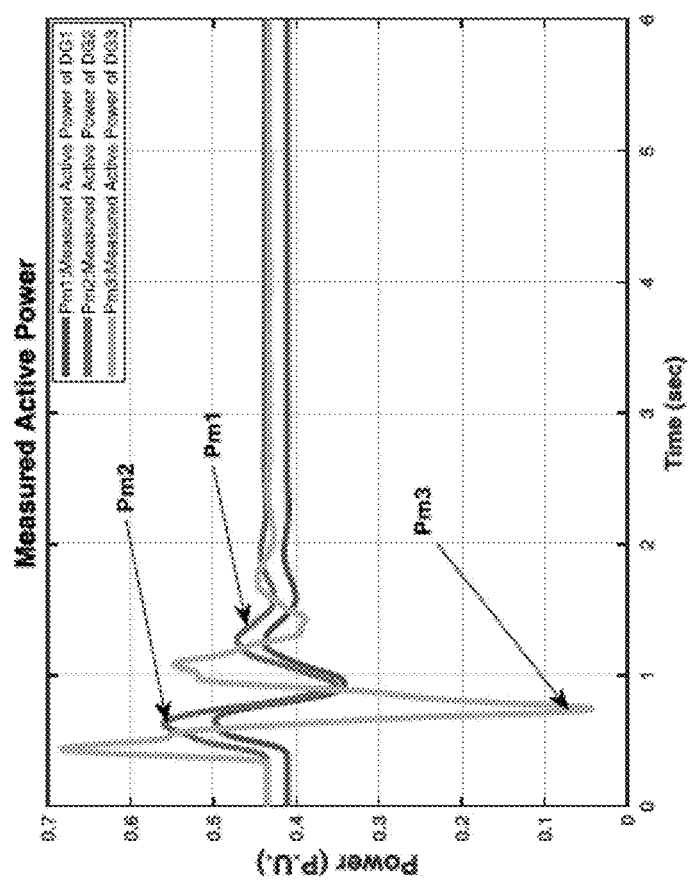
FIG. 17A illustrates a power response of a microgrid when a reference dc voltage stepped up by 5%, in accordance with some embodiments.
Figure 17B:
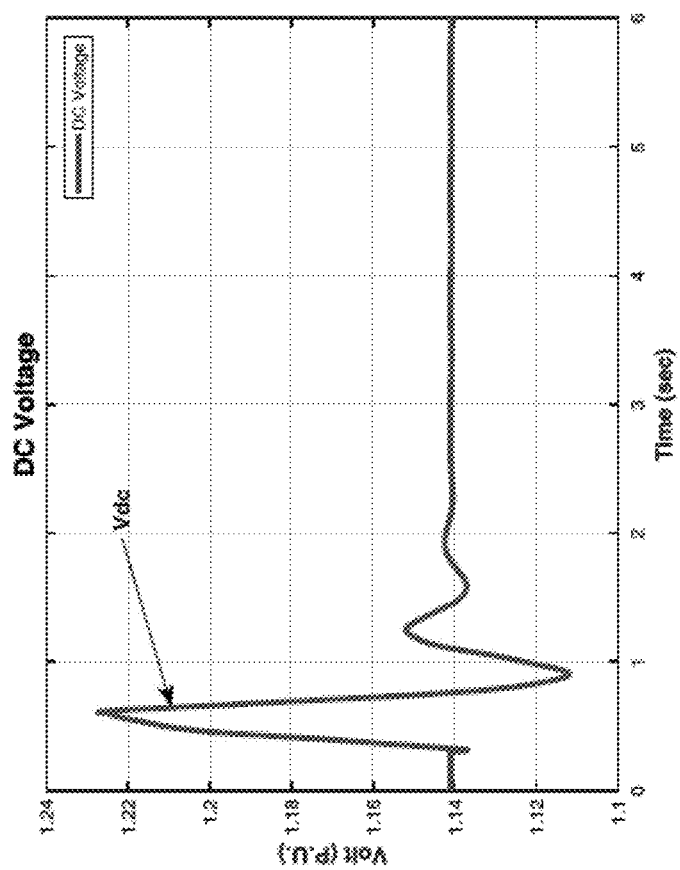
FIG. 17B illustrates a voltage response of a microgrid when a reference dc voltage stepped up by 5%, in accordance with some embodiments.

FIGS. 17A and 17B show the DGs output power response and the DC voltage response of the active load respectively. To demonstrate its superiority over related examples, the presently disclosed controller is finally compared with the controller presented in Bottrell et al. (see Bottrell, N.; Prodanovic, M.; Green, T. Dynamic stability of a microgrid with an active load. IEEE Trans. Power Electron. 2013, 28, 5107-5119). The DC voltage response of the active load in both cases when a three-phase fault occurred at CPL bus can be shown in FIG. 18. Improved parameters are used to show the priority of the presently disclosed case. From the controller results shown, the proposed controller has improved dynamic performance after getting disturbed.

Recently, it has been made possible to simulate electrical networks using a real-time digital simulator (RTDS) to verify a theoretical simulation (see Forsyth, P.; Kuffel, R. Utility applications of a RTDS simulator. In Proceedings of the IPEC International Power Engineering Conference, Singapore, 3-6 Dec. 2007; pp. 112-117; Li, Y.; Vilathgamuwa, D.; Loh, P. Design, analysis, and real-time testing of a controller for multibus microgrid system. IEEE Trans. Power Electron. 2004, 19, 1195-1204). The simulation could be performed faster in RTDS since it works continuously in sustained real-time. Microgrid elements such as loads, converter bridges, filters, and lines can be modeled inside the RTDS environmental using their physical representation built in a standard library blocks. Additionally, each power system component has its detailed model, which is already built in RTDS library. This model can resemble the real system. The converter (inverter/rectifier) bridge is ideally modeled. The inverters controllers and active load controllers are implemented in the RTDS using the parameters obtained from PSO. The performance of the proposed controllers has been comprehensively tested.

Figure 19A:
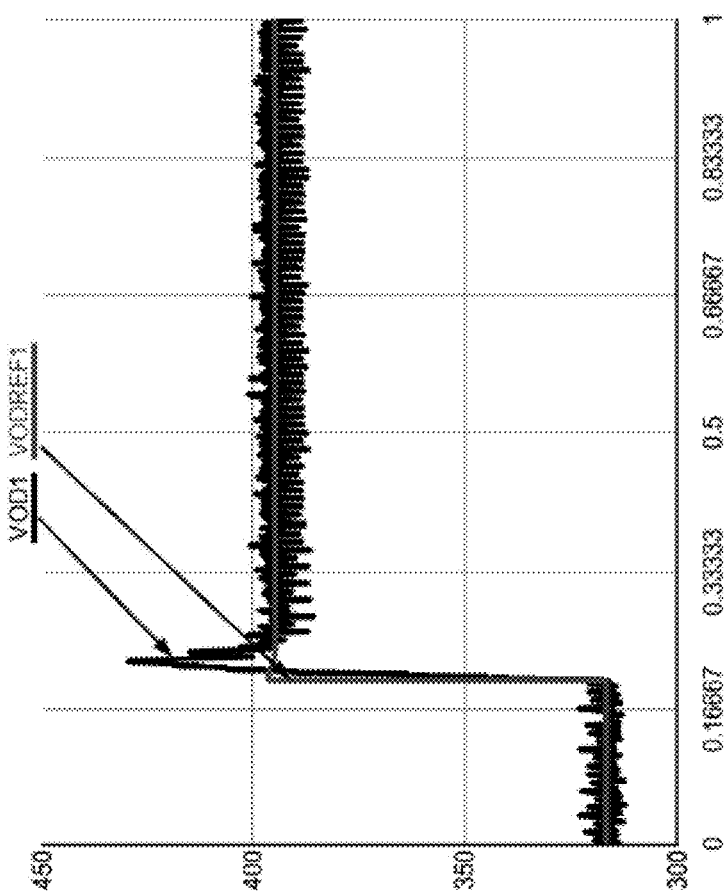
FIG. 19A illustrates a DG1 output voltage, in accordance with some embodiments.
Figure 19B:
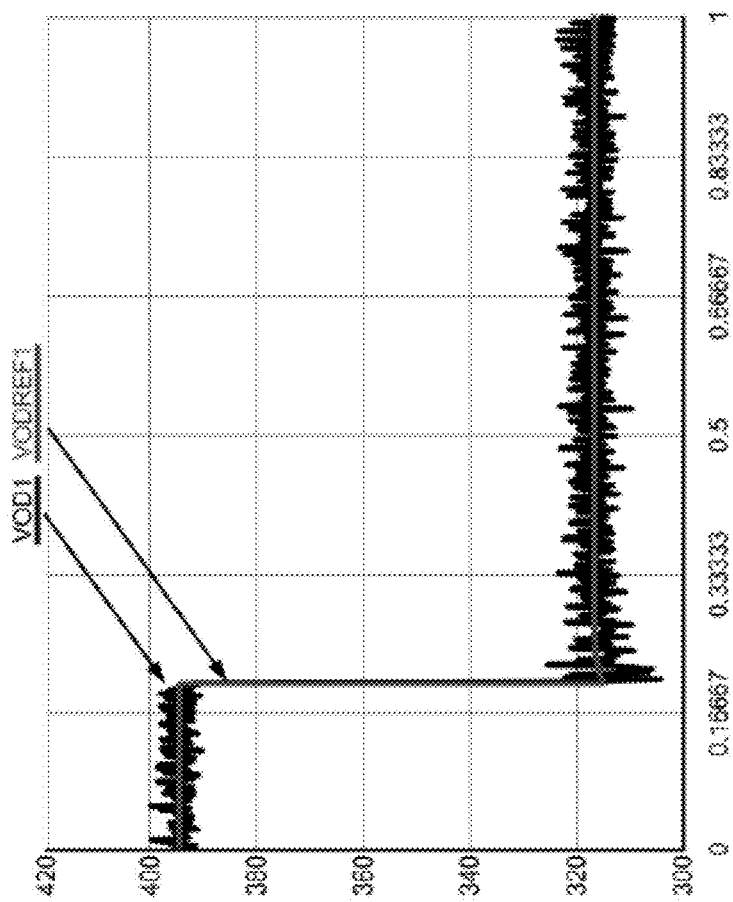
FIG. 19B illustrates a DG1 reference voltage due to voltage step changes, in accordance with some embodiments.
Figure 20A:
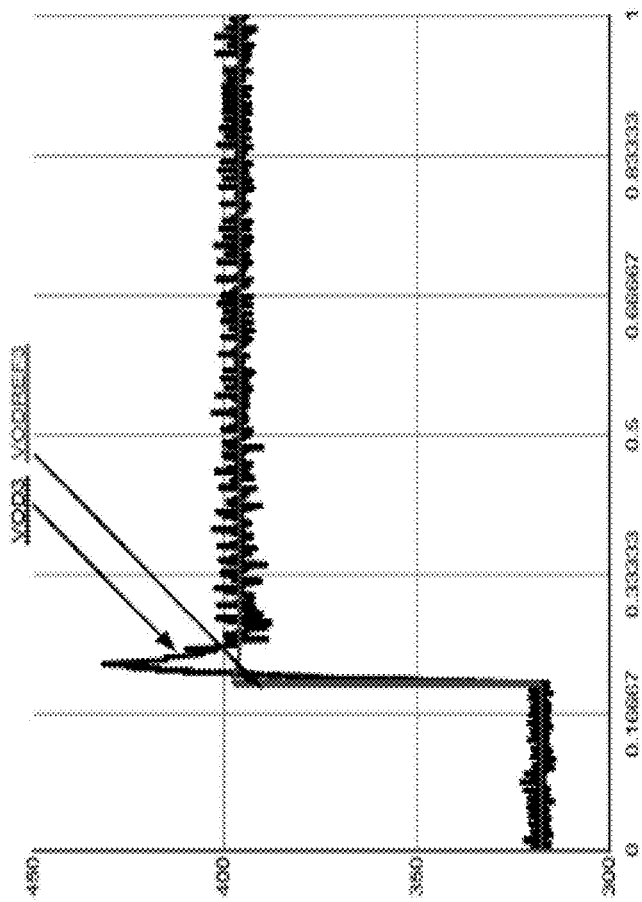
FIG. 20A illustrates a DG3 output voltage, in accordance with some embodiments.
Figure 20B:
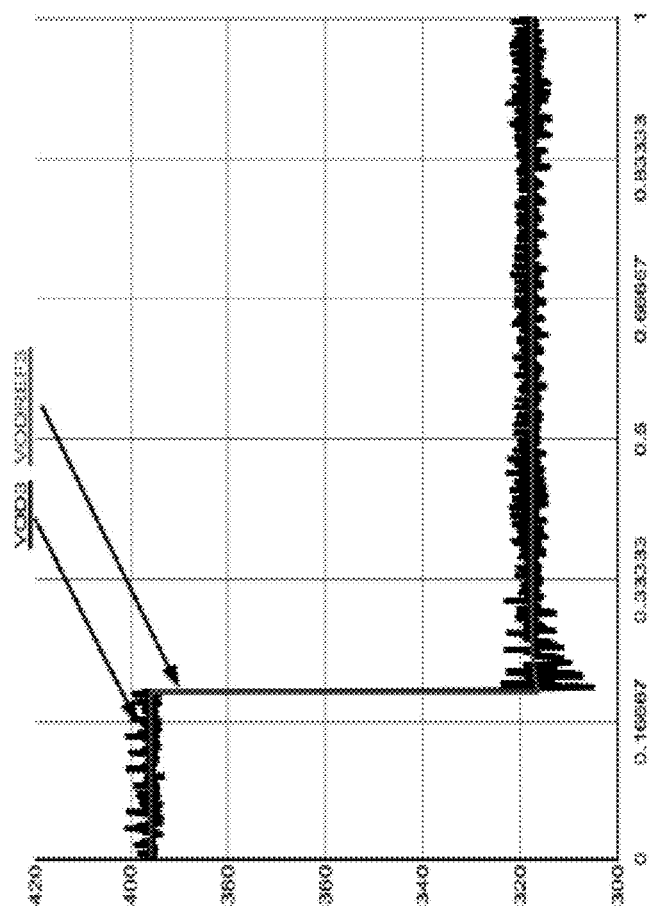
FIG. 20B illustrates a DG3 reference voltage due to voltage step changes, in accordance with some embodiments.

In the present disclosure, RTDS is used to analyze the microgrid 100 of FIG. 1. The microgrid setup that includes the inverter-based DGs and active load circuits is simulated by using the RTDS. In real time, the controller performance of the autonomous microgrid is assessed using the improved controller parameters. The effectiveness of the presently disclosed approach for stability enhancement is investigated. With step up and down changes of the DG1 reference voltage, FIGS. 19A and 19B show the DG1 output voltage and its reference respectively. The results show the controller effectiveness under the severe disturbances. Similarly, step up and down changes for the reference voltage of DG3 are applied to investigate the controller effectiveness. FIGS. 20A and 20B depict the output voltage of the DG3 and its reference due to this change. As shown in the RTDS results, the capability of the controller to track the reference during the step change is satisfactory without significant overshoot and delay time.

In the present disclosure, an autonomous microgrid including active load has been modeled and analyzed. The stability of the inverter-based microgrids considering active load has been assessed. By minimizing the proposed objective function using particle swarm optimization, a control solution has been designed. A weighted objective function was used to curtail the errors in the measured active power and DC voltage based on time-domain simulations. Different AC and DC disturbances were introduced to verify the improved parameters effect on the stability of the microgrid. The presently disclosed controllers successfully coordinate among the distributed energy resources. Results show satisfactory performance with efficient damping characteristics of the considered autonomous microgrid. Additionally, results prove the superiority of the presently disclosed controller over the controller presented in the related examples. A microgrid including three DGs, active loads, and their associated controllers has been developed and implemented on real time digital simulator (RTDS). The performance of three inverter-based DGs as well as the active load of the considered autonomous microgrid with the proposed controllers has been verified on RTDS. The experimental results confirm the effectiveness of the proposed controllers to enhance the stability of the proposed microgrid under different disturbances and operating conditions.

What is claimed is:

1. A method for stabilizing an autonomous microgrid, comprising:

measuring output signals of the autonomous microgrid, wherein the autonomous microgrid includes:

a plurality of inverter-based distributed generations, each of the inverter-based distributed generations further including a corresponding power droop controller configured to share an output power of the respective plurality of inverter-based distribution generations in the autonomous microgrid, a corresponding voltage controller configured to control an output voltage of the respective inverter-based distributed generation, and a corresponding current controller configured to control an output current of the respective inverter-based distributed generation; and a constant power load (CPL) coupled to one of the plurality of inverter-based distributed generations, the CPL constant power load including a phase locked loop (PLL) configured to synchronize the constant power load with the autonomous microgrid, a DC voltage controller configured to control a DC voltage of the CPL, and an AC current controller configured to control an AC current of the CPL; and defining a plurality of system parameters of the autonomous microgrid based on a weighted objective function that is calculated by particle swarm optimization (PSO), wherein the PSO minimizes the weighted objective function to obtain the plurality of system parameters so that the plurality of inverter-based distributed generations injects a required active power and a dc voltage of the active load close to a reference dc voltage.

2. The method of claim 1, wherein the weighted objective function comprises:

minimize $J$, subject to $\{K^{min} \leq K \leq K^{max}, m_p^{min} \leq m_p \leq m_p^{max},$ and $n_q^{min} \leq n_q \leq n_q^{max}\}$, where $J = \int_{t=0}^{t=tsim}[(P_m - P_{ref})^2 + (V_{dc} - V^*_{dc})^2]t dt$, and where J is the weighted objective function, $K = [k_{pv}, k_{iv}, k_{pc}, k_{ic}, k_{pv\_AL}, k_{iv\_AL}, k_{pc\_AL}, k_{ic\_AL}, k_p^{PLL}, k_I^{PLL}]^T$ are controller parameters that are constrained as $K^{min} \leq K \leq K^{max}$, $m_p$ and $n_q$ are power-sharing parameters, t is a minimum settling time, $P_{ref}$ is a reference active power of the plurality of the inverted-based distribution generations and $V^*_{dc}$ is DC reference voltage.

3. The method of claim 1, wherein the defining the plurality of system parameters of the autonomous microgrid comprises:

defining the power-sharing coefficients associated with the plurality of the inverter-based distribution generations, the controller parameters of the power droop controllers, the voltage controllers, and the current controllers; and defining the gains of the phase locked loop, the controller parameters of the dc voltage controller, and the ac current controller.

4. The method of claim 1, wherein the autonomous microgrid further comprises a constant impedance load (CIL) that is coupled to another one of the plurality of inverter-based distributed generations.

5. The method of claim 1, wherein the plurality of the inverter-based distribution generations are serially connected, every two adjacent inverter-based distribution generations being serially connected via a respective transmission line and a respective coupling inductance.

6. The method of claim 1, wherein each of the plurality of the inverter-based distribution generations is connected to one or more filters, and one or more coupling inductances.

7. The method of claim 1, where each of the inverter-based distribution generations comprises a respective power source and a respective inverter.

8. A non-transitory computer-readable medium storing instructions which when executed by a computer cause the computer to perform:

measuring output signals of an autonomous microgrid, wherein the autonomous microgrid includes:

a plurality of inverter-based distributed generations, each of the inverter-based distributed generation further including a corresponding power droop controller configured to share an output power of the respective plurality of inverter-based distribution generations in the autonomous microgrid, a corresponding voltage controller configured to control an output voltage of the respective inverted-based distributed generation, and a corresponding current controller configured to control an output current of the respective inverter-based distributed generation; and a constant power load (CPL) coupled to one of the plurality of inverted-based distributed generations, the CPL constant power load including a phase locked loop (PLL) configured to synchronize the constant power load with the autonomous microgrid, a DC voltage controller configured to control a DC voltage of the constant power load, and an AC current controller configured to control an AC current of the constant power load; and defining a plurality of system parameters of the autonomous microgrid based on a weighted objective function that is calculated through on a particle swarm optimization, wherein the PSO minimize the weighted objective function to obtain the defined system parameters so that the plurality of inverted-based distributed generations injects a required active power and a dc voltage of the active load close to a reference dc voltage.

9. The non-transitory computer-readable medium according to claim 8, wherein the weighted objective function is:

minimize $J$, subject to $\{K^{min} \leq K \leq K^{max}, m_p^{min} \leq m_p \leq m_p^{max},$ and $n_q^{min} \leq n_q \leq n_q^{max}\}$, where $J = \int_{t=0}^{t=t_{sim}} [(P_M - P_{ref})^2 + (V_{dc} - V^*_{dc})^2] t \, dt$, and where J is the weighted objective function, $K = [k_{pv}, k_{iv}, k_{pc}, k_{ic}, k_{pv\_AL}, k_{iv\_AL}, k_{pc\_AL}, k_{ic\_AL}, k_p^{PLL}, k_I^{PLL}]^T$ are controller parameters that are constrained as $K^{min} \leq K \leq K^{max}$, $m_p$ and $n_q$ are power-sharing parameters, t is a minimum settling time, $P_{ref}$ is a reference active power of the plurality of the inverted-based distribution generations and $V^*_{dc}$ is DC reference voltage.

10. The non-transitory computer-readable medium according to claim 8, wherein the autonomous microgrid further comprises a constant impedance load (CIL) that is coupled to another one of the plurality of inverter-based distributed generations.

11. The non-transitory computer-readable medium according to claim 8, wherein the defining the system parameters of the autonomous microgrid comprises:

defining the power-sharing coefficients associated with the plurality of the inverter-based distribution generations, the controller parameters of the power droop controllers, the voltage controllers, and the current controllers; and defining the gains of the phase locked loop, the controller parameters of the dc voltage controller, and the ac current controller.

\* \* \* \* \*